United States Patent [19]

Onishi et al.

[11] Patent Number: 5,091,282
[45] Date of Patent: Feb. 25, 1992

[54] ALKALI SOLUBLE PHENOL POLYMER PHOTOSENSITIVE COMPOSITION

[75] Inventors: Yasunobu Onishi; Hirokazu Niki, both of Yokohama; Yoshihito Kobayashi, Kawasaki; Rumiko Hayase; Toru Ushirogouchi, both of Yokohama, all of Japan

[73] Assignee: Kabushiki Kaisha Toshiba, Kawasaki, Japan

[21] Appl. No.: 504,300

[22] Filed: Apr. 3, 1990

[30] Foreign Application Priority Data

| Apr. 3, 1989 | [JP] | Japan | 1-81453 |
| Jun. 8, 1989 | [JP] | Japan | 1-146503 |
| Jun. 15, 1989 | [JP] | Japan | 1-150444 |
| Jun. 15, 1989 | [JP] | Japan | 1-150445 |

[51] Int. Cl.$^5$ .............................. G03C 1/76
[52] U.S. Cl. .......................... 430/270; 430/923; 430/924; 522/63; 522/120; 522/143
[58] Field of Search ............ 430/270, 923, 924; 522/63, 120, 143

[56] References Cited

U.S. PATENT DOCUMENTS

| 4,409,317 | 10/1985 | Shirashi et al. | 430/270 |
| 4,902,603 | 2/1990 | Slater | 430/270 |
| 4,910,115 | 3/1990 | Simpson | 430/924 |
| 4,920,028 | 4/1990 | Lazarus et al. | 430/270 |
| 4,939,229 | 7/1990 | Bogan | 430/270 |
| 4,948,694 | 8/1990 | Okaoma et al. | 430/924 |

Primary Examiner—Jack P. Brammer
Attorney, Agent, or Firm—Oblon, Spivak, McClelland, Maier & Neustadt

[57] ABSTRACT

This invention includes a photosensitive composition containing an alkali-soluble resin and a compound represented by formula (I), (II) or (III) described in the claims and the specification, a photosensitive composition containing an alkali-soluble polymer, a compound represented by formula (IV) described in the claims and the specification and a basic compound, and a photosensitive composition containing an alkali-soluble polymer, a compound represented by formula (VI) described in the claims and the specification and a compound which produces an acid upon radiation of light. A pattern formation method using these photosensitive compositions includes the steps of dissolving any one of the above photosensitive compositions in an organic solvent to prepare a photosensitive resin solution, coating the photosensitive resin solution on a substrate to form a photosensitive resin layer on the substrate, pattern-exposing the photosensitive resin layer, and developing the exposed resin layer with an aqueous alkaline solution. When the first or second photosensitive composition is used, a good pattern can also be formed by a method including the steps of dissolving either the first or second photosensitive composition in an organic solvent to prepare a photosensitive resin solution, coating the photosensitive resin solution on a substrate to form a photosensitive resin layer on the substrate, pattern-exposing the photosensitive resin layer, heating the pattern-exposed resin layer, exposing the entire surface of the heated resin layer, and developing the entirely exposed resin layer with an aqueous alkaline solution.

18 Claims, No Drawings

ALKALI SOLUBLE PHENOL POLYMER PHOTOSENSITIVE COMPOSITION

BACKGROUND OF THE INVENTION

1. Field of the Invention

The present invention relates to a photosensitive composition and, more particularly, to a photosensitive composition photosensitive to deep UV light.

The present invention also relates to a pattern formation method using the photosensitive composition.

2. Description of the Related Art

In the manufacture of various types of electronic parts requiring micropatterning such as a semiconductor integrated circuit, a photosensitive resin is widely used. Recently, high-density integration of electronic parts has been attempt as multifunctional, high-density electronic equipment has been used. Therefore, finer micropatterning is required.

In order to form such a fine pattern, a step-and-repeat reduction-projecting type mask aligner normally called a "stepper" is widely used as an exposure apparatus. Upon pattern exposure, this apparatus uses, e.g., g rays (wavelength=436 nm), h rays (wavelength=405 nm) and i rays (wavelength=365 nm) from a mercury lamp and XeF (wavelength=350 nm), XeCl (wavelength=308 nm), KrF (wavelength=248 nm), KrCl (wavelength=222 nm), ArF (wavelength=193 nm) and $F_2$ (wavelength=157 nm) of an excimer laser. In order to form a fine pattern, the use of light having a short wavelength is preferred. Therefore, a demand has arisen for a resist having high sensitivity to deep UV light generated by an excimer laser or the like.

An example of a conventionally known photosensitive composition for an excimer laser is a photosensitive composition consisting of an acryl-based polymer such as polymethylmethacrylate (PMMA) or polyglutarmaleimide (PGMI) or a polymer having phenol, and an azide-based photosensitive reagent. A photosensitive composition containing the former polymer, however, has low photosensitivity to an excimer laser and a low dry etching resistance. A composition containing the latter polymer has high sensitivity to an excimer laser and dry etching resistance. Since, however, a sectional shape of a pattern formed by using this composition is an inverted triangle, it is difficult to control exposure and development.

In addition to the above problems, various problems arise in accordance with the type of light source used upon exposure as a minimum size is reduced. When exposure is performed by using light, for example, interference of reflected light caused by steps on a semiconductor substrate largely adversely affects a dimensional precision. When exposure is performed by using an electron beam, a ratio of a height to a width of a fine resist pattern cannot be increased since a proximitry effect is produced by backscattering of electrons.

As one of methods of solving the above problems, a multilayered resist system has been developed. In this system, a plurality of resist layers having different functions are stacked and sequentially patterned from an uppermost layer. In the system, each exposed layer functions as an etching mask for an underlying layer after development. This multilayered resist system is summarized in "Solid State Technology", 74 (1981), and many other studies of the system have been reported. A currently, generally attempted system is a three-layered resist system using upper, middle and lower layers. In this three-layered resist system, the lower layer functions to flatten steps present on the surface of an element and to prevent reflection of light on the element surface which is a cause of low resolution. The middle layer functions as an etching mask upon patterning of the lower layer, and the upper layer functions as a photosensitive layer.

By using the above three-layered resist system, finer patterning than that performed by using a single-layered resist system can be performed. The number of manufacturing steps, however, is increased to result in a cumbersome manufacturing process.

SUMMARY OF THE INVENTION

It is a first object of the present invention to provide a photosensitive composition which has photosensitivity to radiation having a short wavelength such as deep UV light, a high dry etching resistance and wide allowance in exposure and development, and can form a fine pattern having a good sectional shape.

It is a second object of the present invention to provide a method which can perform exposure by using radiation having a short wavelength such as deep UV light, has wide allowance in exposure and development conditions, and can form a fine pattern having a good sectional shape.

It is a third object of the present invention to provide a method which can perform exposure by using radiation having a short wavelength such as deep UV light, has wide allowance in exposure and development conditions, and can form a two-layered pattern having a high dry etching resistance and a good sectional shape with a high aspect ratio.

The first object of the present invention can be achieved by the following first to ninth photosensitive compositions.

The first photosensitive composition is a composition containing an alkali-soluble polymer having phenol skeletons and a compound represented by the following formula (I), (II) or (III):

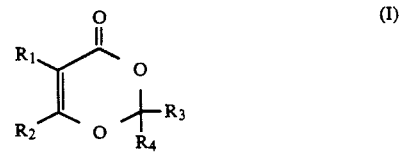
(I)

wherein $R_1$ and $R_2$ may be the same or different and independently represent a hydrogen atom or a substituted or unsubstituted alkyl group having 1 to 10 carbon atoms, and $R_3$ and $R_4$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_3$ and $R_4$ together form a cyclic structure represented by $+CH_2)_n$ (wherein n represents a positive integer of 4 to 8):

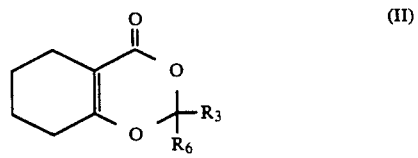
(II)

wherein $R_5$ and $R_6$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_5$ and $R_6$ together form a cyclic structure represented by $-(CH_2)_n-$ (wherein n represents a positive integer of 4 to 8):

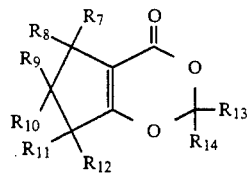

(III)

wherein $R_7$, $R_8$, $R_9$, $R_{10}$, $R_{11}$ and $R_{12}$ may be the same or different and independently represent a hydrogen atom, or a substituted or unsubstituted alkyl group having 1 to 10 carbon atoms, and $R_{13}$ and $R_{14}$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_{13}$ and $R_{14}$ together form a cyclic structure represented by $-(CH_2)_n-$ (wherein n represents a positive integer of 4 to 8).

The second photosensitive composition is a composition according to the first photosensitive composition, wherein each of $R_3$, $R_5$ and $R_{13}$ of formulas (I), (II) and (III), respectively, is a silicon-containing alkyl group or a silicon-containing aryl group, and each of $R_4$, $R_6$ and $R_{14}$ is a hydrogen atom.

The third photosensitive composition is a composition according to the first photosensitive composition, wherein the alkali-soluble polymer having phenol skeletons is a polymer containing silicon.

The fourth photosensitive composition is a composition containing an alkali-soluble polymer having phenol skeletons, a compound represented by the following formula (IV) and a basic compound:

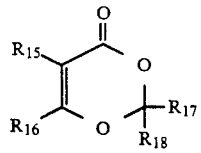

(IV)

wherein $R_{15}$ and $R_{16}$ may be the same or different and independently represent a hydrogen atom or a substituted or unsubstituted alkyl group having 1 to 10 carbon atoms, or $R_{15}$ and $R_{16}$ together form a cyclic structure represented by $-(CH_2)_n-$ (wherein n represents a positive integer of 3 or more) or a cyclic structure in which one or more hydrogen atoms are substituted by alkyl groups, $R_{17}$ represents a hydrogen atom, a substituted or unsubstituted alkyl group having 1 to 10 carbon atoms, a substituted or unsubstituted aryl group, a furyl group, a pyridyl group or a 2-styryl group, and $R_{18}$ represents a hydrogen atom.

The fifth photosensitive composition is a composition containing an alkali-soluble polymer having phenol skeletons, a compound represented by the following formula (V) and a basic compound:

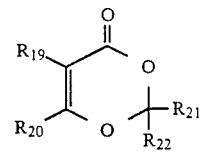

(V)

wherein $R_{19}$ and $R_{20}$ may be the same or different and independently represent a hydrogen atom or a substituted or unsubstituted alkyl group having 1 to 10 carbon atoms, or $R_{19}$ and $R_{20}$ together form a cyclic structure represented by $-(CH_2)_n-$ (wherein n represents a positive integer of 3 or more) or a cyclic structure in which one or more hydrogen atoms are substituted by alkyl groups, $R_{21}$ represents a silicon-containing alkyl group or a silicon-containing aryl group, and $R_{22}$ represents a hydrogen atom.

The sixth photosensitive composition is a composition according to the fourth photosensitive composition, wherein the alkali-soluble polymer having phenol skeletons is a polymer containing silicon.

The above first to sixth photosensitive compositions can be preferably used as a negative resist.

The seventh photosensitive composition is a composition containing an alkali-soluble polymer having phenol skeletons, a compound represented by the following formula (VI) and a compound which produces an acid upon radiation of light:

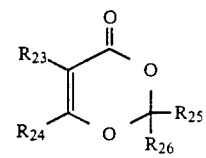

(VI)

wherein $R_{23}$ and $R_{24}$ may be the same or different and independently represent a hydrogen atom or a substituted or unsubstituted alkyl group having 1 to 10 carbon atoms, or $R_{23}$ and $R_{24}$ together form a cyclic structure represented by $-(CH_2)_n-$ (wherein n represents a positive integer of 3 or more) or a cyclic structure in which one or more hydrogen atoms are substituted by alkyl groups, and $R_{25}$ and $R_{26}$ may be the same or different and independently represent a hydrogen atom, a substituted or unsubstituted alkyl group, a substituted or unsubstituted aryl group, a furyl group, a pyridyl group or a 2-styryl group, or $R_{25}$ and $R_{26}$ together form a cyclic structure represented by $-(CH_2)_n-$ (wherein n represents a positive integer of 4 or more).

The eighth photosensitive composition is a composition containing an alkali-soluble polymer having phenol skeletons, a compound represented by the following formula (VII) and a compound which produces an acid upon radiation of light:

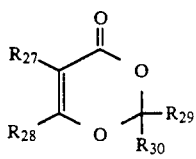

(VII)

wherein $R_{27}$ and $R_{28}$ may be the same or different and independently represent a hydrogen atom or a substituted or unsubstituted alkyl group having 1 to 10 carbon atoms, or $R_{27}$ and $R_{28}$ together form a cyclic structure represented by $-(CH_2)_{\overline{n}}$ (wherein n represents a positive integer of 3 or more) or a cyclic structure in which one or more hydrogen atoms are substituted by alkyl groups, $R_{29}$ represents a silicon-containing alkyl group or a silicon-containing aryl group, and $R_{30}$ represents a hydrogen atom.

The ninth photosensitive composition is a composition according to the seventh photosensitive composition, wherein the alkali soluble-polymer having phenol skeletons is a polymer containing silicon.

The above seventh to ninth photosensitive compositions can be preferably used as a positive resist.

The second object of the present invention can be achieved by a method comprising the steps of:

dissolving any of the above photosensitive compositions in an organic solvent to prepare a photosensitive resin solution;

coating the photosensitive resin solution on a substrate to form a photosensitive resin layer on the substrate;

pattern-exposing the photosensitive resin layer; and developing the exposed resin layer with an aqueous alkali solution.

The second object of the present invention can also be achieved by a method comprising the steps of:

dissolving any of the above first to sixth photosensitive compositions in an organic solvent to prepare a photosensitive resin solution;

coating the photosensitive resin solution on a substrate to form a photosensitive resin layer on the substrate;

pattern-exposing the photosensitive resin layer;

heating the pattern-exposed resin layer;

exposing the entire surface of the heated resin layer; and developing the entirely exposed resin layer with an aqueous alkali solution.

The third object of the present invention can be achieved by a method comprising the steps of:

forming a polymer material layer on a substrate;

dissolving any of the above second, third, fifth, sixth, eighth and ninth photosensitive compositions in an organic solvent to prepare a photosensitive resin solution;

coating the photosensitive resin solution on the polymer material layer to form a photosensitive resin layer;

pattern-exposing the photosensitive resin layer;

developing the pattern-exposed resin layer with an aqueous alkali solution to form a photosensitive resin pattern; and selectively removing an exposed polymer material layer by dry etching by using the photosensitive resin pattern as a mask.

The third object of the present invention can also be achieved by a method comprising the steps of:

forming a polymer material layer on a substrate;

dissolving any of the above second, third, fifth and sixth photosensitive compositions in an organic solvent to prepare a photosensitive resin solution;

coating the photosensitive resin solution on the polymer material layer to form a photosensitive resin layer;

pattern-exposing the photosensitive resin layer;

heating the pattern-exposed resin layer;

exposing the entire surface of the heated resin layer;

developing the entirely exposed resin layer with an aqueous alkali solution to form a photosensitive resin pattern; and selectively removing an exposed polymer material layer by dry etching by using the photosensitive resin pattern as a mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENTS

A first photosensitive composition according to the present invention contains an alkali-soluble polymer having phenol skeletons and a compound represented by the following formula (I), (II) or (III):

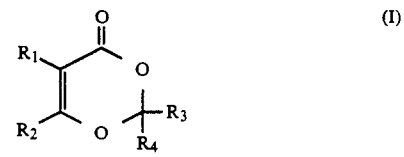

wherein $R_1$ and $R_2$ may be the same or different and independently represent a hydrogen atom or a substituted or unsubstituted alkyl group having 1 to 10 carbon atoms, and $R_3$ and $R_4$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_3$ and $R_4$ together form a cyclic structure represented by $-(CH_2)_{\overline{n}}$ (wherein n represents a positive integer of 4 to 8):

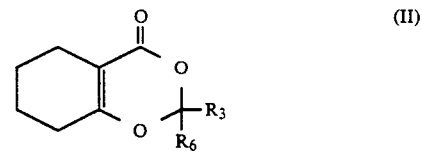

wherein $R_5$ and $R_6$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_5$ and $R_6$ together form a cyclic structure represented by $-(CH_2)_n$ (wherein n represents a positive integer of 4 to 8):

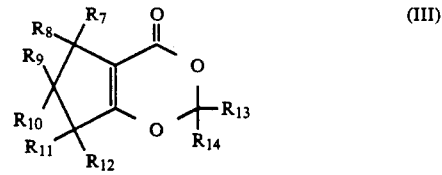

wherein $R_7$, $R_8$, $R_9$, $R_{10}$, $R_{11}$ and $R_{12}$ may be the same or different and independently represent a hydrogen atom, a substituted or unsubstituted alkyl group having 1 to 10 carbon atoms, and $R_{13}$ and $R_{14}$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_{13}$ and $R_{14}$ together form a cyclic structure represented by $-(CH_2)_n$ (wherein n represents a positive integer of 4 to 8).

The alkali-soluble polymer having phenol skeletons used in the first photosensitive composition of the present invention includes a normal alkali-soluble resin, a polysiloxane having phenol on its side chain, a polysilane having phenol on its side chain and a novolak synthesized from phenol having silicon on its side chain.

Examples of the normal alkali-soluble resin are a phenolic novolak, a cresol novolak, a xylenol novolak, a vinyl phenolic resin, an isopropenylphenolic resin, a copolymer of vinylphenol with, e.g., acrylic acid, methacrylic acid derivatives, acrylonitrile or styrene derivatives, a copolymer of isopropenylphenol with, e.g., acrylic acid, methacrylic acid derivatives, acrylonitrile or styrene derivatives, an acrylic resin, a methacrylic resin, a copolymer of acrylic acid or methacrylic acid with acrylonitrile or styrene derivatives, and a copolymer of malonic acid with vinyl ether. More specifically, examples of the alkali-soluble resin are a copolymer (monomer ratio=1:1) of poly(p-vinylphenol) or p-isopropenylphenol with acrylonitrile, a copolymer (monomer ratio=1:1) of p-isopropenylphenol with styrene, a copolymer (monomer ratio=1:1) of a p-vinylphenol with methylmethacrylate, and a copolymer (monomer ratio=1:1) of p-vinylphenol with styrene.

Examples of polysiloxane and polysilane usable in the first photosensitive composition according to the present invention are listed in Tables 1 and 2, respectively, to be presented later.

An example of the novolak usable in the first photosensitive composition of the present invention is a resin obtained by condensing a silicon-containing phenol monomer and phenols with formalin or aldehydes. Examples of the silicon-containing phenol monomer are listed in Table 3 to be presented later. Examples of the phenols are phenol, o-chlorophenol, m-chlorophenol, p-chlorophenol, m-cresol, p-cresol, xylenol, bisphenol A, 4-chloro-3-cresol, dihydroxybenzene and trihydroxybenzene.

A compound represented by formula (I) or (II) for use in the first photosensitive composition of the present invention can be synthesized by, e.g., a method of condensing a keto acid and a carbonyl compound disclosed in M. Sato, H. Ogasawara, K. Oi and T. Kato, "Chem. Pharm. Bull"., 31, 1896 (1986).

A compound represented by formula (II) can also be synthesized by a method of reacting a 2-oxocyclohexane carboxylic acid and a carbonyl compound disclosed in Michiko Yasuda, "Japan Chemical Magazine", 91, 74 (1970).

A compound represented by formula (I), (II) or (III) can be synthesized by a method of reacting an acyl Meldrum's acid and a carbonyl compound disclosed in M. Sato, K. Sekiguchi, H. Ogasawara and C. Kaneko, "Synthesis", 1985, 224.

In the first photosensitive composition, a mixing ratio of a compound represented by formula (I), (II) or (III) to the alkali-soluble polymer having phenol skeletons is preferably 1 to 500 parts by weight, and more preferably, 5 to 300 parts by weight with respect to 100 parts by weight of the polymer. If the mixing ratio of a compound represented by formula (I), (II) or (III) is less than one part by weight, it is difficult to impart sufficient photosensitivity to the photosensitive composition. If the mixing ratio of the compound exceeds 500 parts by weight, coating properties are degraded to make it difficult to form a resist film having a uniform thickness. Especially when $R_3$ of formula (I), $R_5$ of formula (II) or $R_{13}$ of formula (III) is a silicon-containing alkyl group or a silicon-containing aryl group, a mixing ratio of the compound is preferably 200 parts by weight or less with respect to 100 parts by weight of the polymer. If the mixing ratio exceeds 200 parts by weight, coating properties are degraded or an oxygen RIE resistance of a formed pattern is reduced.

In the first photosensitive composition, other additives can be used as needed in addition to the alkali-soluble polymer having phenol skeletons and a compound represented by formula (I), (II) or (III). Examples of the additive are an alkali-soluble resin, a surfactant as a film modifier and a dye as a reflection inhibitor.

Any resin can be used as the alkali-soluble resin as long as it has an aromatic ring and a hydroxyl group in a structural unit. Examples of the resin are a commercially available novolak, poly(p-vinylphenol), poly(p-isopropenylphenol), poly(m-isopropenylphenol), a copolymer of p-hydroxystyrene with methyl methacrylate, a copolymer of p-isopropenylphenol with methyl acrylate, a copolymer of p-hydroxystyrene with methyl acrylate, and a copolymer of p-hydroxystyrene with methacrylic acid.

A composition according to the first photosensitive composition, wherein each of $R_3$ of formula (I), $R_5$ of formula (II) and $R_{13}$ of formula (III) is a silicon-containing alkyl group or a silicon-containing aryl group, and each of $R_4$, $R_6$ and $R_{14}$ is a hydrogen atom, can be preferably used as an upper layer of a two-layered resist system. This composition will be referred to as a second photosensitive composition hereinafter.

Examples of the silicon-containing alkyl group or the silicon-containing aryl group which can be introduced as $R_3$ of formula (I), $R_5$ of formula (II) or $R_{13}$ of formula (III) are the following substituents. The silicon-containing alkyl group is preferably a substituted alkyl group having 1 to 10 carbon atoms, and the silicon-containing aryl group is preferably an aryl group containing a substituted alkyl group having 1 to 10 carbon atoms:

—CH$_2$CH$_2$Si(CH$_3$)$_3$,
—CH$_2$CH$_2$CH$_2$CH$_2$Si(CH$_3$)$_3$,
—CH$_2$CH$_2$CH$_2$CH$_2$CH$_2$Si(CH$_3$)$_3$,
—CH$_2$CH$_2$CH$_2$CH$_2$CH$_2$CH$_2$CH$_2$CH$_2$CH$_2$CH$_2$Si(CH$_3$)$_3$,
—CH$_2$CH$_2$Si(CH$_3$)$_2$—O—Si(CH$_3$)$_3$,
—CH$_2$CH$_2$Si(Ph,Me)—O—Si(Ph)$_3$,
—CH$_2$CH(CH$_3$)Si(CH$_3$)$_2$—O—Si(CH$_3$)$_3$,
—Ph—CH$_2$CH$_2$CH$_2$Si(CH$_3$)$_3$,
—CH$_2$CH$_2$Si(Ph)$_2$CH$_3$,
—CH$_2$CH$_2$SiPh(CH$_2$),
—CH$_2$CH$_2$Si(Ph)$_2$OSi(CH$_3$)$_3$,
—CH$_2$CH(CH$_3$)Si(Ph)$_2$OSi(CH$_3$)$_3$,
—CH$_2$CH(CH$_3$)Si(CH$_3$)$_3$,
—CH$_2$CH(CH$_3$)SiPh2CH$_3$ wherein Ph represents a phenyl group and Me represents a methyl group.

Examples of a compound represented by formula (I), (II) or (III) including those having the above silicon-containing alkyl groups or silicon-containing aryl groups are listed in Table 4 to be presented later.

Similar to the second photosensitive composition, a composition according to the first photosensitive composition, wherein the alkali-soluble polymer is a polymer containing silicon such as a polysiloxane having phenol on its side chain, a polysilane having phenol on its side chain or a novolak synthesized from phenol having silicon on its side chain, can be preferably used as an upper layer of a two-layered resist system. This composition will be referred to as a third photosensitive composition hereinafter.

A fourth photosensitive composition according to the present invention is a composition containing an alkali-soluble polymer having phenol skeletons, a compound represented by the following formula (IV) and a basic compound:

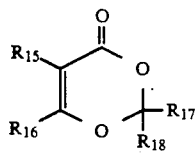
(IV)

wherein $R_{15}$ and $R_{16}$ may be the same or different and independently represent a hydrogen atom or a substituted or unsubstituted alkyl group having 1 to 10 carbon atoms, or $R_{15}$ and $R_{16}$ together form a cyclic structure represented by $-(CH_2)_n-$ (wherein n represents a positive integer of 3 or more) or a cyclic structure in which one or more hydrogen atoms are substituted by alkyl group, $R_{17}$ represents a hydrogen atom, a substituted or unsubstituted alkyl group having 1 to 10 carbon atoms, a substituted or unsubstituted aryl group, a furyl group, a pyridyl group or a 2-styryl group, and $R_{18}$ represents a hydrogen atom.

In the fourth photosensitive composition, polymers similar to those used in the first photosensitive composition can be used as the alkali-soluble polymer having phenol skeletons.

A compound represented by formula (IV) can be synthesized by, e.g., a method of condensing a keto acid and a carbonyl compound disclosed in M. Sato, H. Ogasawara, K. Oi and T. Kato, "Chem. Pharm. Bull.", 31, 1896 (1986) or a method of reacting an acyl Meldrum's acid and a carbonyl compound disclosed in M. Sato, K. Sekiguchi, H. Ogasawara and C. Kaneko, "Synthesis", 1985, 224.

A compound represented by formula (IV), wherein $R_{15}$ and $R_{16}$ together form a cyclic structure and the ring is a 6-membered ring, can be synthesized by using, e.g., a method of reacting a 2-oxocyclohexane carboxylic acid and a carbonyl compound disclosed in Michiko Yasuda, "Japan Chemical Magazine", 91, 74 (1970).

A compound represented by formula (IV), wherein $R_{15}$ and $R_{16}$ together form a cyclic structure and the ring is a 5-membered ring, can be synthesized by using, e.g., a method of reacting adipic chloride and aldehydes or ketones in the presence of a base disclosed in Gerhard Jäger, "Chem. Ber.", 105, PP. 137 to 149 (1972), or a method of heating a 2-diazo-dihydroresorcin and aldehydes or ketones in the presence of merculy (II) chloride disclosed in Hermarn Stetter and Karl Kiehs, "Chem. Ber.", 98, 2099 to 2102 (1965).

In the fourth photosensitive composition, a mixing ratio of a compound represented by formula (IV) to the alkali-soluble polymer having phenol skeletons is preferably 1 to 500 parts by weight, and more preferably, 5 to 300 parts by weight with respect to 100 parts by weight of the polymer. If the mixing ratio of a compound represented by formula (IV) is less than one part by weight, it is difficult to impart sufficient photosensitivity to the photosensitive composition. If the ratio of the compound exceeds 500 parts by weight, coating properties are degraded to make it difficult to form a resist film having a uniform film thickness.

Examples of the basic compound usable in the fourth photosensitive composition are a thiazole and its derivatives, an imidazole and its derivatives, an oxazole and its derivatives, a pyridine and its derivatives, and a tertiary amine. A mixing ratio of the basic compound to the alkali-soluble polymer is preferably 0.1 to 500 parts by weight, and most preferably, 0.5 to 300 parts by weight with respect to 100 parts by weight of the polymer. If the mixing ratio of the basic compound is less than 0.1 parts by weight, it is difficult to obtain effects of the basic compound. If the ratio exceeds 500 parts by weight, coating properties are degraded.

A composition according to the fourth photosensitive composition, wherein a compound represented by the following formula (V) is used instead of a compound represented by formula (IV) can be preferably used as an upper layer of a two-layered resist system:

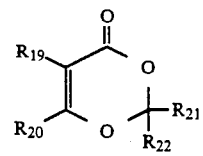
(V)

wherein $R_{19}$ and $R_{20}$ may be the same or different and independently represent a hydrogen atom or a substituted or unsubstituted alkyl group having 1 to 10 carbon atoms, or $R_{19}$ and $R_{20}$ together form a cyclic structure represented by $-(CH_2)_n-$ (wherein n represents a positive integer of 3 or more) or a cyclic structure in which one or more hydrogen atoms are substituted by alkyl groups, $R_{21}$ represents a silicon-containing alkyl group or a silicon-containing aryl group, and $R_{22}$ represents a hydrogen atom. This composition will be referred to as a fifth photosensitive composition hereinafter.

In a compound represented by formula (V), substituents similar to those used in the second photosensitive composition can be used as the silicon-containing alkyl group or silicon-containing aryl group to be introduced as $R_{21}$. A compound represented by formula (V) can be synthesized by methods similar to those for synthesizing a compound represented by formula (IV).

In the fifth photosensitive composition, a mixing ratio of a compound represented by formula (V) is preferably 1 to 200 parts by weight, and most preferably, 5 to 100 parts by weight with respect to 100 parts by weight of the polymer. If the mixing ratio exceeds 200 parts by weight, coating properties are degraded or an oxygen RIE resistance of a formed pattern is reduced.

Examples of a compound represented by formula (IV) or (V) are listed in Table 5 to be presented later.

A composition according to the fourth photosensitive composition, wherein a polymer containing silicon such as a polysiloxane having phenol on its side chain, a polysilane having phenol on its side chain or a novolak synthesized from phenol having silicon on its side chain is used as the alkali-soluble polymer having phenol skeletons, can be preferably used as an upper layer of a two-layered resist system. This composition will be referred to as a sixth photosensitive composition hereinafter.

In the sixth photosensitive composition, a mixing ratio of a compound represented by formula (IV) is preferably 1 to 200 parts by weight, and most preferably, 5 to 100 parts by weight with respect to 100 parts by weight of the alkali-soluble polymer.

In each of the fifth and sixth photosensitive compositions, a mixing ratio of the basic compound is preferably 0.1 to 200 parts by weight, and more preferably, 0.5 to 100 parts by weight with respect to 100 parts by weight of the alkali-soluble polymer.

When light is radiated on a resist film formed by using any of the fourth to sixth photosensitive compositions according to the present invention, a compound represented by formula (IV) or (V) contained in a portion irradiated with the light is decomposed. The alkali-soluble polymer contained in the composition reacts with a main product produced upon decomposition of the compound to become insoluble in an alkaline solution. Therefore, when development is performed by using a suitable alkaline solution, in which the alkali-soluble polymer contained in the composition is soluble, as a developing solution, the alkali-soluble polymer in the irradiated portion is not dissolved, but only the alkali-soluble polymer in the portion not irradiated with the light is dissolved and removed, thereby forming a pattern.

Upon decomposition of a compound represented by formula (IV) or (V), an aldehyde represented by:

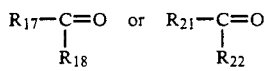

is produced as a by-product. These aldehydes are easily dissolved in an alkaline solution. Therefore, if these aldehydes are present in the portion irradiated with the light, the portion may be dissolved and removed by a developing solution to interfere formation of a correct pattern. In each of the fourth to sixth photosensitive composition according to the present invention, however, the basic compound contained in the composition accelerates the reaction between the aldehydes and the alkali-soluble polymer. Therefore, no aldehyde remains in the portion irradiated with the light. For this reason, each of the fourth to sixth photosensitive compositions according to the present invention can be used as a negative resist to form a very precise pattern.

In the fourth to sixth photosensitive compositions of the present invention, similar to the first to third photosensitive compositions, other additives can be mixed as needed in addition to the alkali-soluble compound having phenol skeletons, a compound represented by formula (IV) or (V) and the basic compound. Examples of the additive are an alkali-soluble resin, a surfactant as a film modifier and a dye as a refection inhibitor.

The seventh photosensitive composition according to the present invention contains an alkali-soluble polymer having phenol skeletons, a compound represented by the following formula (VI) and a compound which produces an acid upon radiation of light:

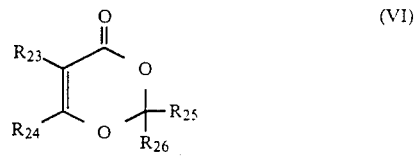

wherein $R_{23}$ and $R_{24}$ may be the same or different and independently represent a hydrogen atom or a substituted or unsubstituted alkyl group having 1 to 10 carbon atoms, or $R_{23}$ and $R_{24}$ together form a cyclic structure represented by $-(CH_2)_n-$ (wherein n represents a positive integer of 3 or more) or a cyclic structure in which one or more hydrogen atoms are substituted by alkyl groups, and $R_{25}$ and $R_{26}$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_{25}$ and $R_{26}$ together form a cyclic structure represented by $-(CH_2)_n-$ (wherein n represents a positive integer of 4 or more).

In the seventh photosensitive composition, polymers similar to those used in the first photosensitive composition can be used as the alkali-soluble polymer having phenol skeletons.

A compound represented by formula (VI) can be synthesized by a method of condensing a keto acid and a carbonyl compound disclosed in M. Sato, H. Ogasawara, K. Oi and T. Kato, "Chem. Pharm. Bull.", 31, 1896 (1986) or a method of reacting an acyl Meldrum's acid and a carbonyl compound disclosed in M. Sato, K. Sekiguchi, H. Ogasawara and C. Kaneko, "Synthesis", 1985, 224.

A compound represented by formula (VI), wherein $R_{23}$ and $R_{24}$ together form a cyclic structure and the ring is a 6-membered ring, can be synthesized by a method of reacting a 2-oxocyclohexanecarboxylic acid and a carbonyl compound disclosed in Michiko Yasuda, "Japan Chemical Magazine", 91, 74 (1970).

A compound represented by formula (VI), wherein $R_{23}$ and $R_{24}$ together form a cyclic structure and the ring is a 5-membered ring, can be synthesized by a method of reacting adipic chloride and aldehydes or ketones in the presence of a base disclosed in Gerhard Jäger, "Chem. Ber.", 105, PP. 137 to 149 (1972) or a method of heating a 2-diazo-dihydroresorcin and aldehydes or ketones in the presence of mercury (II) chloride disclosed in Hermarn Stetter and Karl Kiehs, "Chem. Ber.", 98, PP. 2099 to 2102 (1965).

In the seventh photosensitive composition, a mixing ratio of a compound represented by formula (VI) to the alkali-soluble polymer having phenol skeletons is preferably 1 to 500 parts by weight, and more preferably, 5 to 300 parts by weight with respect to 100 parts by weight of the polymer. If the mixing ratio of a compound represented by formula (VI) is less than one part by weight, it is difficult to impart sufficient photosensitivity to the photosensitive composition. If the ratio of the compound exceeds 500 parts by weight, coating properties are degraded to make it difficult to form a resist film having a uniform film thickness.

In the seventh photosensitive composition, various known compounds and their mixtures can be used as the compound which produces an acid upon radiation of light. Examples of the compound are a diazonium salt such as $CF_3SO_3^-$, $P\text{-}CH_3PhSO_3^-$ and $P\text{-}NO_2PhSO_3^-$, a phosphonium salt, a sulfonium salt or an iodonium salt, an organic halide, and orthoquinone-diazidesulfonyl chloride. All organic halides known as a photoinitiator for forming a free radical are compounds which produce a halogenated hydroacid and can be used in the seventh photosensitive composition. Examples of the compound are di(para-tertiarybutylbenzene)diphenyliodonium trifluoromethanesulfonate, benzointosylate, ortho-nitrobenzyl para-toluenesulfonate, triphenylsulfonium trifluoromethanesulfonate, tri(tertiarybutylphenyl)sulfonium trifluoromethanesulfonate, benzenediazonium para-toluenesulfonate tris-dibromomethyl-s-triazine, and o-naphthoquinonediazide-4-sulfonic acid chloride.

A mixing ratio of the compound which produces an acid upon radiation of light is preferably about 0.01 to about 10 parts by weight, and more preferably, 0.1 to 5 parts by weight with respect to the total weight of a solid component of the photosensitive composition. If the mixing ratio is less than 0.01 parts by weight, the effect of the compound cannot be obtained. If the ratio exceeds 10 parts by weight, coating properties are degraded.

A composition according to the seventh photosensitive composition, wherein a compound represented by the following formula (VII) is used instead of a compound represented by formula (VI), can be preferably used as an upper layer of a two-layered resist system:

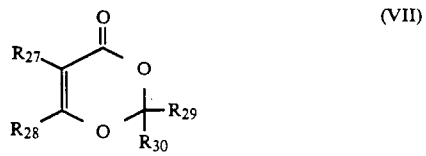

(VII)

wherein $R_{27}$ and $R_{28}$ may be the same or different and independently represent a hydrogen atom or a substituted or unsubstituted alkyl group having 1 to 10 carbon atoms, or $R_{27}$ and $R_{28}$ together forms a cyclic structure represented by $-(CH_2)_n-$ (wherein n represents a positive integer of 3 or more) or a cyclic structure in which one or more hydrogen atoms are substituted by alkyl groups, $R_{29}$ represents a silicon-containing alkyl group or a silicon-containing aryl group, and $R_{30}$ represents a hydrogen atom. This composition will be referred to as an eighth photosensitive composition hereinafter.

In a compound represented by formula (VII), substituents similar to those used in the second photosensitive composition can be used as the silicon-containing alkyl group or silicon-containing aryl group to be introduced as $R_{29}$. A compound represented by formula (VII) can be synthesized by a method similar to a method of synthesizing a compound represented by formula (VI).

In the eighth photosensitive composition, a mixing ratio of a compound represented by formula (VII) is preferably 1 to 200 parts by weight, and more preferably, 5 to 100 parts by weight with respect to 100 parts by weight of the alkali-soluble polymer. If the mixing ratio exceeds 200 parts by weight, an oxygen RIE resistance of a formed pattern is reduced.

Examples of a compound represented by formula (VI) or (VII) are listed in Table 6 to be presented later.

A photosensitive composition according to the seventh photosensitive composition, wherein a polymer containing silicon such as a polysiloxane having phenol on its side chain, a polysilane having phenol on its side chain or a novolak synthesized from phenol having silicon on its side chain is used as the alkali-soluble polymer having phenol skeletons, can be preferably used as an upper layer in a two-layered resist system. This composition will be referred to as a ninth photosensitive composition.

In the ninth photosensitive composition, a mixing ratio of a compound represented by formula (VI) is preferably 1 to 200 parts by weight, and more preferably, 5 to 100 parts by weight with respect to 100 parts by weight of the silicon-containing polymer. Similar to the eighth photosensitive composition, if the mixing ratio exceeds 200 parts by weight, coating properties are degraded or an oxygen RIE resistance of a formed pattern is reduced.

In the eighth and ninth photosensitive compositions, the mixing ratio of the compound which produces an acid upon radiation of light is preferably about 0.01 to about 10 parts by weight, and more preferably 0.1 to 5 parts by weight with respect to the total weight of a solid component of the photosensitive composition for the same reason as in the seventh photosensitive composition.

When light is radiated on any of the seventh to ninth photosensitive compositions according to the present invention, a compound represented by formula (VI) or (VII) is decomposed. A main product produced upon decomposition of the compound reacts with water present in the photosensitive composition to produce carboxylic acid. The produced carboxylic acid can be dissolved by performing development by using a developing solution mainly consisting of an aqueous alkaline solution in which the alkali-soluble polymer contained in the photosensitive composition is insoluble. By dissolving the produced carboxylic acid, only a portion irradiated with the light is dissolved and removed to form a pattern. For this reason, these photosensitive compositions can be preferably used as a positive resist.

In each of the seventh to ninth photosensitive compositions according to the present invention, an acid produced by the compound which produces an acid upon radiation of light accelerates the reaction of producing the carboxylic acid. Therefore, pattern formation can be performed with high precision.

The seventh to ninth photosensitive compositions according to the present invention can also be used as a negative resist. In order to use these compositions as a negative resist, light radiation is performed first, heating is then performed, and finally development is performed by using a suitable aqueous alkaline solution in which the alkali-soluble polymer contained in these photosensitive compositions is soluble as a developing solution. As a result, the alkali-soluble polymer in a portion not irradiated with the light is dissolved and removed by the developing solution. In a portion irradiated with the light, a compound represented by formula (VI) or (VII) is decomposed as described above. A main product produced upon decomposition of the compounds reacts with the alkali-soluble polymer and water contained in the composition. The alkali-soluble polymer which reacts with the main product obtained by decomposition becomes insoluble in alkali, and the carboxylic acid produced by the reaction between the main product obtained by decomposition and water is decomposed upon the subsequent heating treatment. Therefore, the portion irradiated with the light is neither dissolved nor removed by the developing solution.

As a result, only the portion irradiated with the light remains to form a pattern.

In each of the seventh to ninth photosensitive compositions according to the present invention, other additives can be mixed as needed in addition to the above compounds. Examples of the additive are an alkali-soluble resin, a surfactant as a film modifier and a dye as a reflection inhibitor.

Any resin can be used as the alkali-soluble resin as long as it has an aromatic ring and a hydroxyl group as a structural unit. Examples of the resin are a commercially available novolak, poly(p-vinylphenol), poly(p-isopropenylphenol), poly(m-isopropenylphenol), a copolymer of p-hydroxystyrene and methyl methacrylate, a copolymer of p-isopropenylphenol and methyl acrylate, a copolymer of p-hydroxystyrene and methyl acrylate, and a copolymer of p-hydroxystyrene and methacrylic acid.

A pattern formation method using the first to sixth photosensitive compositions according to the present invention will be described below.

First, any of the first to sixth photosensitive compositions is dissolved in an organic solvent to prepare a photosensitive resin solution. Examples of the usable organic solvent are a ketone-based solvent such as cyclohexanone, acetone, methylethylketone and methylisobutylketone; a cellosolve-based solvent such as methylcellosolve, methylcellosolve acetate, ethylcellosolve acetate and butylcellosolve acetate; and an ester-based solvent such as ethyl acetate, butyl acetate and isoamyl acetate. These solvents can be used singly or in a combination of two or more thereof.

The photosensitive resin solution prepared as described above is coated on a substrate by, e.g., a spin-coating method or a dipping method and dried to form a resist film. Examples of the substrate on which the photosensitive resin solution is coated are a silicon wafer, a silicon wafer having steps on its surface formed by various types of insulating films, electrodes, wirings and the like, and a blank mask.

After the resist film is formed on the substrate, deep UV light is radiated on the resist film through a mask having a desired pattern. Examples of a light source of deep UV light are a mercury lamp and an excimer laser of, e.g., XeF (wavelength=351 nm), XeCl (wavelength=308 nm), KrF (wavelength=248 nm), KrCl (wavelength=222 nm), ArF (wavelength=193 nm) and $F_2$ (wavelength=157 nm). After the resist film is exposed by deep UV light, it is developed by an aqueous alkaline solution. A nonexposed portion of the resist film is dissolved and removed by this development to form a desired pattern. In this case, any aqueous alkaline solution can be used as long as it smoothly dissolves the nonexposed portion of the resist film and has an extremely low dissolution rate with respect to an exposed portion. Examples of the aqueous alkaline solution are an aqueous tetraalkylammonium-based solution such as an aqueous tetramethylammoniumhydroxide solution; and an aqueous inorganic alkaline solution such as potassium hydroxide and sodium hydroxide. These aqueous alkaline solutions are normally used at a concentration of 15 wt % or less. A dipping method, a spraying method or the like can be adopted as a developing method. The substrate subjected to development is washed by a washing solution such as water to remove the developing solution.

As described above, the second, third, fifth and sixth photosensitive compositions according to the present invention can be preferably used especially as an upper layer of a two-layered resist system. A two-layered resist system using these photosensitive compositions will be described below.

After a flattening agent is coated on a substrate, baking is performed at a temperature of 100° C. to 250° C. for 30 to 150 minutes to form a flattening layer having a desired thickness. Examples of the substrate for forming the flattening layer are a silicon wafer, a silicon wafer having steps on its surface formed by various types of insulating films, electrodes, wirings and the like, and a blank mask. Examples of the flattening agent are a positive resist comprising substituted naphthoquinonediazide and a novolak, polystyrene, polymethylmethacrylate, polyvinylphenol, a novolak, polyester, polyvinylalcohol, polyethylene, polypropylene, polyimide, polybutadiene, polyvinyl acetate and polyvinylbutyral. These resins can be used singly or in a combination of two or more thereof.

Any of the second, third, fifth and sixth photosensitive compositions is dissolved in an organic solvent to prepare a photosensitive resin solution. Examples of the usable solvent are a ketone-based solvent such as cyclohexanone, acetone, methylethylketone and methylisobutylketone; a cellosolve-based solvent such as methylcellosolve, methylcellosolve acetate, ethylcellosolve acetate and butylcellosolve acetate; and an ester-based solvent such as ethyl acetate, butyl acetate and isoamyl acetate. These solvents can be used singly or in a combination of two or more thereof.

The prepared photosensitive resin solution is coated on the flattening layer formed on the substrate and then dried to form a resist film having a desired thickness. Drying is performed at a temperature of 150° C. or less, and preferably, 50° C. to 120° C. The photosensitive resin solution can be coated on the flattening layer by, e.g., a spin-coating method using a spinner, a dipping method, a spraying method and a printing method. The thickness of the resist film can be arbitrarily adjusted by a coating method, the concentration of a silicon-containing substance in the photosensitive composition or the viscosity of the photosensitive resin solution.

Deep UV light is radiated on the resist film on the flattening layer through a mask having a desired pattern. As a result of radiation of deep UV light, the solubility of an exposed portion of the resist in an aqueous alkaline solution becomes lower than that of its nonexposed portion. Although an optimal exposure amount upon exposure depends on the type of component constituting the resist film, it is normally 1 mJ/cm$^2$ to 10 J/cm$^2$. An exposure mode may be either contact exposure or projection exposure.

The exposed resist film is developed by an aqueous alkaline solution. The nonexposed portion of the resist film is dissolved and removed by development to form a desired pattern. As described above, examples of the aqueous alkaline solution used in development are an aqueous tetraalkylammonium-based solution and an aqueous inorganic alkaline solution. The concentration of the aqueous alkaline solution is normally 15 wt % or less. A dipping method, a spraying method or the like can be adopted as a developing method.

The flattening layer is etched by an oxygen reactive ion etching (oxygen RIE) method using the resist film having the pattern formed thereon as a mask. Upon etching, a film consisting of silicon dioxide ($SiO_2$) or a similar film is formed on the surface of the resist film having the pattern formed thereon. The oxygen RIE resistance of the resist film, thus, becomes 10 to 100 times that of the exposed flattening layer. Therefore, only a portion of the flattening layer exposed in accordance with the pattern of the resist film is selectively removed by etching to obtain an optimal pattern profile.

The pattern obtained as described above functions as a mask to be used upon etching of the substrate. A wet etching method and a dry etching method are known as a substrate etching method. Examples of a wet etching agent used in the wet etching method are an aqueous hydrofluoric acid solution and an aqueous ammonium fluoride solution when a silicon oxide film is to be etched; aqueous solutions of phosphoric acid, acetic acid and nitric acid when aluminum is to be etched; and an aqueous ammonium cerium nitrate solution when a chromium-based film is to be etched. Examples of a dry etching gas used in the dry etching method are $CF_4$, $C_2F_6$, $CCl_4$, $BCl_3$, $Cl_2$ and HCl. These gases can be used singly or in a combination of two or more thereof as needed. The dry etching method is preferred in order to etch a fine pattern having a line width of 3 μm or less. The etching conditions such as the concentration of a wet etching agent in a reaction bath, the concentration of a dry etching gas, the reaction temperature and the reaction time are determined on the basis of a combination of the type of material on which a fine pattern is to be formed and a photosensitive composition used. The determination method, however, is not limited to this.

After etching, the pattern constituted by the flattening layer and the photosensitive composition remaining on the substrate is removed by, e.g., a stripping agent such as J-100 (tradename: available from Nagase Kasi K.K.) or an oxygen gas plasma.

In addition to the above manufacturing steps, an arbitrary step can be added in accordance with an application. For example, a pre-treatment step performed before each solution is coated for improving adhesion properties between the resist layer comprising a photosensitive composition according to the present invention and the flattening layer or between the flattening layer and the substrate, a baking step performed before or after development and an ultraviolet re-radiation step performed before dry etching can be added.

A pattern can be formed by using any of the seventh to ninth photosensitive compositions by the single-layer process used for the first to sixth photosensitive compositions and by using the eighth or ninth photosensitive composition by the two-layer process used for the second, third, fifth or sixth photosensitive compositions are used, an exposed portion of a resist film is dissolved and removed when the seventh to ninth photosensitive compositions are used.

Besides the above method, a fine pattern having a good sectional shape can be formed in accordance with the following method. In this method, the first to sixth photosensitive compositions can be preferably used.

First, a pattern formation method according to the single-layer process using any of the first to fourth photosensitive compositions will be described below.

Any of the first to fourth photosensitive compositions is dissolved in an organic solvent to prepare a photosensitive resin solution. Examples of the usable organic solvent are a ketone-based solvent such as cyclohexanone, acetone, methylethylketone and methylisobutylketone; a cellosolve-based solvent such as methylcellosolve, methylcellosolve acetate, ethylcellosolve acetate and butylcellosolve acetate; and an ester-based solvent such as ethyl acetate, butyl acetate and isoamyl acetate. These solvents can be used singly or in a combination of two or more thereof.

This photosensitive resin solution is coated on a substrate by, e.g., a spin-coating method or a dipping method and then dried to form a resist film. Examples of the substrate on which the resist film is to be formed are a silicon wafer, a silicon wafer having steps formed by various types of insulating films, electrodes, wirings and the like, a blank mask, and a semiconductor wafer consisting of a groups III-V compound such as GaAs or AlGaAs.

After the resist film is formed on the substrate, deep UV light is selectively radiated on the resist film through a mask having a desired pattern to perform pattern exposure. Examples of a light source of deep UV light are a mercury lamp and an excimer laser of, e.g., XeF (wavelength=351 nm), XeCl (wavelength=308 nm), KrF (wavelength=248 nm), KrCl (wavelength=222 nm), ArF (wavelength=193 nm) and $F_2$ (wavelength=157 nm).

After deep UV light is radiated, the resist film is heated by using a hot plate or the like. Upon this heating, a crosslinking reaction occurs in a pattern-exposed portion of the resist film to reduce the solubility of this portion in a developing solution. As a result, a solubility difference is produced between exposed and nonexposed portions to convert the resist film into a so-called negative pattern. The temperature of this heating treatment is preferably 60° C. to 150° C., and more preferably, 80° C. to 120° C. If the temperature is less than 60° C. since the crosslinking reaction in the pattern-exposed portion of the resist film does not sufficiently progress, reverse into a negative pattern is not sufficiently performed. If the temperature exceeds 150° C., since crosslinking takes place not only in the pattern-exposed portion but also in the nonexposed portion, selective reverse into a negative pattern may not be performed.

After the heating treatment, the entire surface of the resist layer is exposed. The wavelength of light radiated upon exposure is preferably 450 nm or less. Examples of the light are g rays (wavelength=436 nm), rays (wavelength=405 nm) and i rays (wavelength=365 nm) emitted from a mercury lamp, light emitted from a xenon mercury lamp, and an excimer laser selected from those enumerated above. Upon this entire-surface exposure, the solubility of the nonexposed portion in the developing solution is increased. Since the exposed portion is already crosslinked upon exposure, the solubility in the developing solution remains unchanged. Therefore, in this exposure step, the difference in solubility in the developing solution is further increased between the exposed and nonexposed portions.

After the entire-surface exposure, the resist film is developed by using an aqueous alkaline solution. Examples of the aqueous alkaline solution used as a developing solution are an aqueous organic alkaline solution such as an aqueous tetramethylammonium hydroxide solution, and an aqueous inorganic alkaline solution such as potassium hydroxide and sodium hydroxide. These aqueous alkaline solutions are normally used at a concentration of 15 wt % or less. A dipping method, a spraying method or the like can be used as a developing method. Upon this development, the nonexposed portion of the resist film is selectively dissolved and removed to form a desired pattern (negative pattern). After the development, a rinsing treatment may be performed by using, e.g., water.

The two-layer process using any of the second, third, fifth and sixth photosensitive compositions will be described below.

A polymer material is coated on a substrate and baked at a temperature of 100° C. to 250° C. for 30 to 150 minutes to form a polymer material layer, i.e., a flattening layer having a desired thickness. In this case, any polymer material can be used as long as it has a purity high enough to pose no problem in the manufacture of a semiconductor device and the like. Examples of the polymer material are a positive resist comprising substituted o-quinonediazide and a novolak, polystyrene, polymethyl methacrylate, polyvinyl phenol, a novolak, polyester, polyvinyl alcohol, polyethylene, polypropylene, polyimide, polybutadiene, polyvinyl acetate and polyvinyl butyral. These resins can be used singly or in a combination of two or more thereof. The substrate on which the polymer material is to be coated is similar to that used in the single-layer process described above.

Any of the second, third, fifth and sixth photosensitive compositions is dissolved in an organic solvent to prepare a photosensitive resin solution. The organic solvent for dissolving the photosensitive composition is similar to that used in the single-layer process described above.

The prepared photosensitive resin solution is coated on the polymer material layer and then dried to form a resist film. Examples of a coating method of the photosensitive resin solution are a spin-coating method using a spinner, a dipping method, a spraying method and a printing method.

After the resist film is formed, deep UV light is selectively radiated on the resist film through a mask having a desired pattern to perform pattern exposure, as in the single-layer process. A light source of deep UV light is similar to those used in the single-layer process.

After the deep UV light is radiated, the resist film is heated by using a hot plate or the like. Upon this heating, a crosslinking reaction occurs in a pattern-exposed portion of the resist film to reduce the solubility of this portion in a developing solution. As a result, a solubility difference is produced between exposed and nonexposed portions to convert the resist film into a so-called negative pattern. The temperature of the heating treatment is similar to that in the single-layer process.

After the heating treatment, the entire surface of the resist film is exposed. The wavelength of light radiated upon exposure is preferably 450 nm or less. Practical examples of a light source are described in the single-layer process. Upon this entire-surface exposure, the solubility of the nonexposed portion in a developing solution is increased. Since the exposed portion is sufficiently crosslinked upon exposure, its solubility in a developing solution remains unchanged. Therefore, by this exposure step, the difference in solubility in a developing solution is further increased between the exposed and nonexposed portions.

After the entire-surface exposure, the resist film is developed by using an aqueous alkaline solution. This aqueous alkaline solution used as a developing solution is similar to that used in the above single-layer process. A dipping method, a spraying method or the like can be used as a developing method. By this development the nonexposed portion of the resist film is selectively dissolved and removed to form a desired pattern (negative pattern).

After the negative pattern is formed, an exposed polymer material layer is etched by an oxygen reactive ionetching (oxygen RIE) method by using the negative pattern as a mask. As described above, any of the second, third, fifth and sixth photosensitive compositions according to the present invention is used to form the negative pattern in this two-layer process. That is, the resin constituting the negative pattern contains silicon. In the oxygen RIE method, silicon contained in the resin reacts with oxygen to form a film consisting of silicon dioxide ($SiO_2$) or a similar film on the surface of the negative pattern. The oxygen RIE resistance of the negative pattern, thus, becomes 10 to 100 times that of the exposed polymer material layer. Therefore, a portion of the polymer material layer not covered with the negative pattern is selectively removed by the oxygen RIE method to obtain an optimal pattern profile.

The pattern formed as described above functions as a mask to be used upon etching of the substrate. A wet etching method and a dry etching method are known as a substrate etching method. Examples of a wet etching agent used in the wet etching method are an aqueous hydrofluoric acid solution and an aqueous ammonium fluoride solution when a silicon oxide film is to be etched; aqueous solutions of phosphoric acid, acetic acid and nitric acid when aluminum is to be etched; and an aqueous ammonium cerium nitrate solution when a chromium-based film is to be etched. Examples of a dry etching gas used in the dry etching method are $CF_4$, $C_2F_6$, $CCl_4$, $BCl_3$, $Cl_2$, $HCl$ and $H_2$. These gases can be used singly or in a combination of two or more thereof as needed. The dry etching method is preferred in order to etch a fine pattern having a line width of 3 μm or less. The etching conditions such as the concentration of a wet etching agent in a reaction bath, the concentration of a dry etching gas, the reaction temperature and the reaction time are determined on the basis of a combination of the type of material on which a fine pattern is to be formed and a photosensitive composition used. The determination method, however, is not limited to this.

After etching, the pattern constituted by the flattening layer and the photosensitive composition remaining on the substrate are removed by, e.g., a stripping agent such as J-100 (tradename: available from Nagase Kasei K.K.) or an oxygen gas plasma.

In addition to the above manufacturing steps, an arbitrary step can be added in accordance with an application. Examples of the additional step are a rinsing (normally using water) step in order to remove the developing agent after the resist film is developed; and a pretreatment step performed before each solution is coated for improving adhesion properties between the resist film comprising a photosensitive composition according to the present invention and the flattening layer or between the flattening layer and the substrate, a baking step performed before or after development and an ultraviolet re-radiation step performed before dry etching can be added.

By using the first to ninth photosensitive compositions of the present invention, a semiconductor device such as an LSI having a fine pattern can be manufactured by the above method.

The present invention will be described in detail below by way of its examples.

EXAMPLE 1

70 g of poly(p-vinylphenol) and 30 g of a compound synthesized from 2-methyl acetoacetate and acetone listed in Table 7 to be presented later were dissolved in 250 g of ethyl cellosolve acetate. The resultant solution was filtered by using a 0.2-μm thick membrane filter consisting of a fluoroplastic to prepare a photosensitive resin solution.

This photosensitive resin solution was coated on a silicon wafer and heated and dried on a hot plate at 90° C. for five minutes to form a 1.0-μm thick resist film. Subsequently, the resist film was exposed (200 mJ/cm$^2$) by a reduced projection exposure apparatus using KrF excimer laser light (248 nm). The exposed resist film was dipped and developed in an aqueous tetramethylammonium hydroxide solution (to be referred to as an aqueous TMAH solution hereinafter) having a concentration of 1.8 wt % for one minute. As a result, a 0.3-μm wide highly precise pattern having a rectangular sectional shape was formed.

EXAMPLE 2

75 g of an m,p-cresol novolak and 25 g of a compound represented by a formula listed in Table 7 to be presented later were dissolved in 250 g of ethyl cellosolve acetate. The resultant solution was filtered by a 0.2-μm thick membrane filter consisting of a fluoroplastic to prepare a photosensitive resin solution.

Following the same procedures as in Example 1, a resist film was formed from the prepared photosensitive resin solution and exposed. The exposed resist film was dipped and developed in an aqueous TMAH solution having a concentration of 2.38 wt % for one minute. As a result, a 0.3-μm wide highly precise pattern having a rectangular sectional shape was formed.

EXAMPLE 3

The photosensitive resin solution prepared in Example 1 was coated on an aluminum film formed on a silicon wafer. Thereafter, following the same procedures as in Example 1, a resist film was formed and exposed. After exposure, the resist film was developed to form a 0.3-μm wide pattern.

An exposed aluminum film was dry-etched with CBrCl$_3$ gas by using the formed pattern as a mask. As a result, the 0.3-μm wide pattern could be accurately transferred onto the aluminum film.

COMPARATIVE EXAMPLE 1

A polymethylmethacrylate solution was coated on an aluminum film formed on a silicon wafer and was dried to form a resin film.

Following the same procedures as in Example 1, the formed resin film was exposed (10 J/cm$^2$) and developed to form a pattern. Thereafter, an exposed aluminum film was dry-etched with CBrCl$_3$ gas by using the formed pattern as a mask. As a result, the polymethylmethacrylate pattern disappeared during etching of aluminum and therefore could not be perfectly transferred.

EXAMPLE 4

70 g of polysiloxane represented by a formula listed in Table 7 to be presented later and 30 g of a compound represented by a formula listed in the same table were dissolved in 400 g of ethyl cellosolve acetate. The resultant solution was filtered by using a 0.2-μm thick membrane filter consisting of a fluoroplastic to prepare a silicon-containing photosensitive resin solution.

Meanwhile, a resist consisting of a commercially available novolak was coated on a silicon wafer to have a thickness of 2.0 μm and heated at 200° C. for 30 minutes to form a flattening layer. The above silicon-containing photosensitive resin solution was coated on the flattening layer to have a thickness of 0.6 μm and prebaked at 90° C. for five minutes. After prebaking, the resist was exposed by using KrF excimer laser light having a wavelength of 248 nm. After exposure, the resist was dipped and developed in a 1.0 wt % aqueous TMAH solution for one minute to form a pattern. The flattening layer was etched by an oxygen RIE method by using the formed pattern as a mask.

After etching was performed by the oxygen RIE method, a section of the pattern of the flattening layer was observed by a scanning electron microscope. As a result, it was confirmed that this pattern had a sharp profile having a film thickness of 2.3 μm and a line width and a line interval of 0.3 μm.

EXAMPLE 5

70 g of polysiloxane represented by a formula listed in Table 7 to be presented later and 30 g of a compound represented by a formula listed in the same table were dissolved in 400 g of ethyl cellosolve acetate. The resultant solution was filtered by a 0.2-μm thick fluoroplastic membrane filter to prepare a silicon-containing photosensitive resin solution.

Following the same procedures as in Example 4, a flattening layer was formed on a silicon wafer, a resist film was formed on the flattening layer and exposed and developed, and the flattening layer was etched by oxygen RIE. As a result, a pattern having a sharp profile having a film thickness of 2.3 μm and a line width and a line interval of 0.3 μm was obtained.

EXAMPLE 6

70 g of a novolak represented by a formula listed in Table 7 to be presented later and synthesized from phenol having silicon on its side chain and 30 g of a compound represented by a formula listed in the same table were dissolved in 400 g of ethyl cellosolve acetate. The resultant solution was filtered by a 0.2-μm thick fluoroplastic membrane filter to prepare a silicon-containing photosensitive resin solution.

Following the same procedures as in Example 4, a flattening layer was formed on a silicon wafer, a resist film was formed on the flattening layer and exposed and developed, and the flattening layer was etched by oxygen RIE. Note that an aqueous TMAH solution having a concentration of 3.0 wt % was used as a developing solution. As a result, a pattern having a sharp profile having a film thickness of 2.3 μm and a line width and a line interval of 0.3 μm was obtained.

EXAMPLE 7

70 g of polysiloxane represented by a formula listed in Table 7 to be presented later and 30 g of a silicon-containing compound represented by a formula listed in the same table were dissolved in 400 g of ethyl cellosolve acetate. The resultant solution was filtered by a 0.2-μm thick fluoroplastic membrane filter to prepare a silicon-containing photosensitive resin solution.

Following the same procedures as in Example 4, a flattening layer was formed on a silicon wafer, a resist film was formed on the flattening layer and exposed and developed, and the flattening layer was etched by oxygen RIE. A pattern section of the flattening layer obtained as described above was observed by a scanning electron microscope. As a result, it was confirmed that this pattern had a sharp profile having a film thickness of 2.3 μm and a line width and a line interval of 0.3 μm.

EXAMPLE 8

70 g of polysiloxane represented by a formula listed in Table 7 to be presented later and 30 g of a silicon-containing compound represented by a formula listed in the same table were dissolved in 400 g of ethyl cellosolve acetate. The resultant solution was filtered by a 0.2-μm thick fluoroplastic membrane filter to prepare a silicon-containing photosensitive resin solution.

Following the same procedures as in Example 4, a flattening layer was formed on a silicon wafer, a resist film was formed on the flattening layer and exposed and developed, and the flattening layer was etched by oxygen RIE. As a result, a pattern having a sharp profile having a film thickness of 2.3 μm and a line width and a line interval of 0.3 μm was formed.

EXAMPLE 9

70 g of a novolak represented by a formula listed in Table 7 to be presented later and synthesized from phenol having silicon on its side chain and 30 g of a silicon-containing compound represented by a formula listed in the same table were dissolved in 400 g of ethyl cellosolve acetate. The resultant solution was filtered by a 0.2-μm thick fluoroplastic membrane filter to prepare a silicon-containing photosensitive resin solution.

Following the same procedures as in Example 4, a flattening layer was formed on a silicon wafer, a resist film was formed on the flattening layer and exposed and developed, and the flattening layer was etched by oxygen RIE. Note that an aqueous TMAH solution having a concentration of 3.0 wt % was used as a developing solution. As a result, a pattern having a sharp profile having a film thickness of 2.3 μm and a line width and a line interval of 0.3 μm was formed.

EXAMPLE 10

70 g of poly(p-vinylphenol) and 30 g of a silicon-containing compound represented by a formula listed in Table 7 to be presented later were dissolved in 400 g of ethyl cellosolve acetate. The resultant solution was filtered by a 0.2-μm thick fluoroplastic membrane filter to prepare a silicon-containing photosensitive resin solution.

Following the same procedures as in Example 4, a flattening layer was formed on a silicon wafer, a resist film was formed on the flattening layer and exposed and developed, and the flattening layer was etched by oxygen RIE. As a result, a pattern having a sharp profile having a film thickness of 2.3 μm and a line width and a line interval of 0.3 μm was formed.

EXAMPLE 11

70 g of poly(p-vinylphenol), 25 g of a compound represented by a formula listed in Table 8 to be presented later, and 15 g of pyridine were dissolved in 250 g of ethyl cellosolve acetate. The resultant solution was filtered by a 0.2-μm thick fluoroplastic membrane filter to prepare a photosensitive resin solution.

The prepared photosensitive resin solution was coated on a silicon wafer and dried on a hot plate at 90° C. for five minutes to form a 1.0 μm thick resist film. Thereafter, pattern exposure (200 mJ/cm$^2$) was performed for the resist film by a reduced projection exposure apparatus using krF excimer laser light (248 nm). The exposed resist film was heated on a hot plate at 110° C. for two minutes and the entire surface of the film was exposed by using a mercury lamp (200 mJ/cm$^2$). After the entire surface was exposed, the resultant resist film was dipped and developed in an aqueous TMAH solution having a concentration of 1.8 wt % to form a negative pattern.

EXAMPLES 12–14

75 g of an m,p-cresol novolak and 25 g of each compound represented by a formula listed in Table 8 to be presented later, respectively, were dissolved in 250 g of ethyl cellosolve acetate. The resultant solution was filtered by a 0.2-μm thick fluoroplastic membrane filter to prepare three types of photosensitive resin solutions.

Following the same procedures as in Example 11, each photosensitive resin solution was coated and dried on a silicon wafer, and a formed resist film was subjected to pattern exposure, a heating treatment and entire-surface exposure. The resist film subjected to the entire-surface exposure was developed by an aqueous TMAH solution having a concentration of 2.38 wt % to form a negative pattern. As a result, three types of negative patterns were formed.

Sectional shapes of the negative patterns obtained in Examples 11 to 14 were checked. The check results are summarized in Table 8.

As is apparent from Table 8, in each of Examples 11 to 14, a fine, rectangular and highly precise negative pattern was formed.

EXAMPLE 15

70 g of polysiloxane represented by a formula listed in Table 9 to be presented later and 30 g of a compound represented by a formula listed in the same table were dissolved in 400 g of ethyl cellosolve acetate. The resultant solution was filtered by a 0.2 μm thick fluoroplastic membrane filter to prepare a photosensitive resin solution.

Meanwhile, a polymer material solution consisting of a commercially available novolak was coated on a silicon substrate to have a thickness of 2.0 μm and heated at 220° C. for 30 minutes to form a flattening layer.

The photosensitive resin solution was coated on the flattening layer to have a thickness of 0.6 μm and then heated and dried on a hot plate at 90° C. for five minutes to form a resist film. Pattern exposure (200 mJ/cm$^2$) was performed for the resist film by using KrF excimer laser light having a wavelength of 248 nm. After exposure, the resist film was heated on a hot plate at 110° C. for two minutes, and the entire surface of the film was exposed by using a mercury lamp (200 mJ/cm$^2$). After entire-surface exposure, the resist film was dipped and developed in an aqueous TMAH solution having a concentration of 1.0 wt % for one minute to form a negative pattern (upper pattern).

The silicon substrate having the upper pattern formed thereon was put into a dry etching apparatus (HIRRIE (tradename): available from Tokuda Seisakusho K.K.), and reactive ion etching (RIE) using an oxygen plasma was performed for two minutes by using the upper pattern as a mask, thereby etching the underlying flattening layer. The etching conditions were an output of 0.8 W/cm$^2$, an oxygen gas pressure of 4 pa and a flow rate of 50 SCCM.

EXAMPLE 16

70 g of polysiloxane represented by a formula listed in Table 9 to be presented later and 30 g of a compound represented by a formula listed in the same table were dissolved in 400 g of ethyl cellosolve acetate. The resultant solution was filtered by a 0.2-μm thick fluoroplastic membrane filter to prepare a photosensitive resin solution.

Meanwhile, a polymer material solution consisting of a commercially available novolak was coated on a silicon substrate to have a thickness of 2.0 μm and heated at 200° C. for 30 minutes to form a polymer material layer (flattening layer).

Following the same procedures as in Example 15, the photosensitive resin solution was coated on the formed flattening layer and dried to form a resist film, and the formed resist film was subjected to pattern exposure, a heating treatment and entire-surface exposure. After entire-surface exposure, the resist film was developed with an aqueous TMAH solution having a concentration of 2.38 wt % to form a negative pattern (upper pattern). Thereafter, oxygen RIE was performed for the underlying flattening layer by using the upper pattern as a mask.

EXAMPLE 17

70 g of polysiloxane represented by a formula listed in Table 9 to be presented later and 30 g of a compound represented by a formula listed in the same table were dissolved in 400 g of ethyl cellosolve acetate. The resultant solution was filtered by a 0.2-μm thick fluoroplastic membrane filter to prepare a photosensitive resin solution.

Meanwhile, a polymer material solution consisting of a commercially available novolak was coated on a silicon substrate to have a thickness of 2.0 μm and heated at 200° C. for 30 minutes to form a polymer material layer (flattening layer).

The photosensitive resin solution was coated on the flattening layer and dried at 90° C. for five minutes to form a resist film. Pattern exposure (250 mJ/cm$^2$) was performed for the resist film by using KrF excimer laser light (248 nm). The exposed resist film was heated at 120° C. for one minute, and the entire surface of the film was exposed (200 mJ/cm$^2$) by using a mercury lamp. After entire-surface exposure, the resist film was developed by an aqueous TMAH solution having a concentration of 2.38 wt % to form a negative pattern. Thereafter, following the same procedures as in Example 15, oxygen RIE was performed for the underlying flattening layer by using the upper pattern as a mask.

EXAMPLE 18

70 g of polysiloxane represented by a formula listed in Table 9 to be presented later and 30 g of a compound represented by a formula listed in the same table were dissolved in 400 g of ethyl cellolsove acetate. The resultant solution was filtered by a 0.2-μm thick fluoroplastic membrane filter to prepare a photosensitive resin solution.

Thereafter, following the same procedures as in Example 17, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying temperature of the coated photosensitive resin solution was 100° C., pattern exposure for the resist film was performed at 300 mJ/cm$^2$, the heating temperature after the pattern exposure was 140° C., and entire-surface exposure was performed at 150 mJ/cm$^2$.

A pattern shape of the flattening layer obtained after oxygen RIE was performed in each of Examples 15 to 18 was observed by a scanning electron microscope. The results are summarized in Table 9. Note that numerals in Table 9 denote a line width and a line interval, and the film thickness of each resist film was 2 3 μm.

As is apparent from Table 9, in each of Examples 15 to 18, a two-layered pattern having a sharp profile having a fine line width and a fine line interval of 0.28 μm was formed.

EXAMPLE 19

70 g of poly(p-vinylphenol) and 50 g of a silicon-containing compound represented by a formula listed in Table 10 to be presented later were dissolved in 400 g of ethyl cellosolve acetate. The resultant solution was filtered by a 0.2-μm thick fluoroplastic membrane filter to prepare a photosensitive resin solution.

Separately, a polymer material solution consisting of a commercially available novolak was coated on a silicon substrate to have a thickness of 2.0 μm and heated at 200° C. for 30 minutes to form a polymer material layer (flattening layer).

The photosensitive resin solution was coated on the formed flattening layer and dried at 90° C. for five minutes to form a resist film. Pattern exposure (300 mJ/cm$^2$) was performed for the resist film by using KrF excimer laser light (248 nm). The exposed resist film was heated at 140° C. for one minute, and the entire surface of the film was exposed (120 mJ/cm$^2$) by using a mercury lamp. After entire-surface exposure, development was performed by using an aqueous TMAH solution having a concentration of 2.38 wt % to form a negative pattern (upper pattern). Following the same procedures as in Example 15, oxygen RIE was performed for the underlying flattening layer by using the upper pattern as a mask.

EXAMPLE 20

70 g of poly(p-vinylphenol) and 50 g of a silicon-containing compound represented by a formula listed in Table 10 to be presented later were dissolved in 400 g of ethyl cellosolve acetate. The resultant solution was filtered by a 0.2-μm thick fluoroplastic membrane filter to prepare a photosensitive resin solution.

Following the same procedures as in Example 19, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying temperature of the coated photosensitive resin solution was 100° C., pattern exposure for the resist film was performed at 250 mJ/cm$^2$, the heating temperature after pattern exposure was 120° C., and entire-surface exposure was performed at 150 mJ/cm$^2$.

EXAMPLE 21

70 g of polysiloxane represented by a formula listed in Table 10 to be presented later and 30 g of a silicon-containing compound represented by a formula listed in the same table were dissolved in 250 g of ethyl cellosolve acetate. The resultant solution was filtered by a 0.2-μm thick fluoroplastic membrane filter to prepare a photosensitive resin solution.

Following the same procedures as in Example 19, a flattening layer was formed on a silicon substrate, the photosensitive resin solution was coated and dried on the flattening layer to form a resist film, the resist pattern was subjected to pattern exposure, a heating treatment, entire-surface exposure and development, and the flattening layer was subjected to oxygen RIE. Note that the heating temperature after pattern exposure was 120° C., and entire-surface exposure was performed at 150 mJ/cm$^2$.

EXAMPLE 22

70 g of polysiloxane represented by a formula listed in Table 10 to be presented later and 30 g of a silicon-containing compound represented by a formula listed in the same table were dissolved in 250 g of ethyl cellosolve acetate. The resultant solution was filtered by a 0.2-μm thick fluoroplastic membrane filter to prepare a photosensitive resin solution.

Following the same procedures as in Example 19, a flattening layer was prepared on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying temperature of the photosensitive resin solution coated was 80° C., pattern exposure of the resist film was performed at 200 mJ/cm$^2$, the heating temperature after pattern exposure was 120° C., and entire-surface exposure was performed at 150 mJ/cm$^2$.

In each of Examples 19 to 22, the shape of a pattern of the flattening layer formed on the silicon substrate after the oxygen RIE was observed by a scanning electron microscope. The results are summarized in Table 10. Note that numerals in Table 10 represent a line width and a line interval and a corresponding film thickness was 2.3 μm.

As is apparent from Table 10, in each of Examples 19 to 22, a two-layered pattern having a fine line width and a fine line interval of 0.25 μm and a sharp pattern profile was formed.

EXAMPLE 23

70 g of poly(p-vinylphenol), 30 g of a compound synthesized from furfural and adipic acid chloride and represented by a formula listed in Table 11, and 15 g of 2-methyl benzimidazole were dissolved in 250 g of ethyl cellosolve acetate. The resultant solution was filtered by a 0.2 μm thick fluoroplastic membrane filter to prepare a photosensitive resin solution.

The prepared photosensitive resin solution was coated on a silicon wafer and dried on a hot plate at 90° C. for five minutes to form a 1.0 μm thick resist film. The resist film was exposed (50 mJ/cm$^2$) by a reduced projection exposure apparatus using KrF excimer laser light (248 nm). After exposure, the resist film was dipped and developed in an aqueous TMAH solution having a concentration of 1.8 wt % for one minute. As a result, a highly precise resist pattern having a line width of 0.3 μm and a rectangular sectional shape was formed.

EXAMPLE 24

75 g of an m,p-cresol novolak, 25 g of a compound represented by a formula listed in Table 11, and 15 g of 2-methyl benzimidazole were dissolved in 250 g of ethyl cellosolve acetate. The resultant solution was filtered by a 0.2 μm thick fluoroplastic membrane filter to prepare a photosensitive resin solution.

Following the same procedures as in Example 23, the prepared photosensitive resin solution was used to form a resist film on a silicon wafer, and the formed resist film was exposed. Thereafter, the resist film was developed by using an aqueous TMAH solution having a concentration of 2.38 wt %. As a result, a highly precise resist pattern having a line width of 0.3 μm and a rectangular sectional shape was formed.

EXAMPLE 25

70 g of poly(p-vinylphenol), 25 g of a compound represented by a formula listed in Table 11, and 15 g of pyridine were dissolved in 250 g ethyl cellosolve acetate. The resultant solution was filtered by a 0.2 μm thick fluoroplastic membrane filter to prepare a photosensitive resin solution.

Following the same procedures as in Example 23, the prepared photosensitive resin solution was used to form a resist film on a silicon wafer, and the formed resist film was exposed. Thereafter, the resist film was developed by using an aqueous TMAH solution having a concentration of 2.38 wt %. As a result, a highly precise resist pattern having a line width of 0.3 μm and a rectangular sectional shape was formed.

EXAMPLE 26

75 g of an m,p-cresol novolak, 25 g of a compound represented by a formula listed in Table 11, and 10 g of 2-methyl benzimidazole were dissolved in 250 g of ethyl cellosolve acetate. The resultant solution was filtered by a 0.2 μm thick fluoroplastic membrane filter to prepare a photosensitive resin solution.

Following the same procedures as in Example 23, the prepared photosensitive resin solution was used to form a resist film on a silicon wafer, and the formed resist film was exposed. Thereafter, the resist film was developed by using an aqueous TMAH solution having a concentration of 2.38 wt %. As a result, a highly precise resist pattern having a line width of 0.3 μm and a rectangular sectional shape was formed.

EXAMPLE 27

70 g of poly(p-vinylphenol), 25 g of a compound represented by a formula listed in Table 11, and 20 g of tributylamine were dissolved in 250 g of ethyl cellosolve acetate. The resultant solution was filtered by a 0.2 μm thick fluoroplastic membrane filter to prepare a photosensitive resin solution.

Following the same procedures as in Example 23, the prepared photosensitive resin solution was used to form a resist film on a silicon wafer, and the formed resist film was exposed. Thereafter, the resist film was developed by using an aqueous TMAH solution having a concentration of 2.38 wt %. As a result, a highly precise resist pattern having a line width of 0.3 μm and a rectangular sectional shape was formed.

EXAMPLE 28

An aluminum film was formed on a silicon wafer, and the photosensitive resin solution prepared in Example 23 was coated on the aluminum film to form a resist film. The resist film was exposed and developed following the same procedures as in Example 23 to form a resist pattern having a line width of 0.3 μm.

The resist pattern was used as a mask to perform dry etching of an exposed aluminum film by using CBrCl$_3$ gas. As a result, the pattern having a line width of 0.3 μm could be precisely transferred onto the aluminum film.

EXAMPLE 29

An aluminum film was formed on a silicon wafer, and the photosensitive resin solution prepared in Example 25 was coated on the aluminum film to form a resist film. The resist film was exposed and developed following the same procedures as in Example 23 to form a resist pattern having a line width of 0.3 μm.

The resist pattern was used as a mask to perform dry etching for an exposed aluminum film by using $CBrCl_3$ gas. As a result, the pattern having a line width of 0.3 μm could be precisely transferred onto the aluminum film.

COMPARATIVE EXAMPLE 2

An aluminum film was formed on a silicon wafer, and a polymethyl methacrylate solution was coated on the aluminum film to form a resin film. The resin film was exposed and developed following the same procedures as in Example 23 to form a resist pattern.

The resist pattern was used as a mask to perform dry etching for an exposed aluminum film by using $CBrCl_3$ gas. As a result, the polymethyl methacrylate pattern disappeared during etching of aluminum and therefore could not be transferred.

EXAMPLE 30

70 g of polysiloxane represented by a formula listed in Table 11 to be presented later, 30 g of a compound represented by a formula listed in the same table, and 10 g of 2-methyl benzthiazole were dissolved in 250 g of ethyl cellosolve acetate. The resultant solution was filtered by a 0.2 μm thick fluoroplastic membrane filter to prepare a photosensitive resin solution.

Meanwhile, a polymer material consisting of a commercially available novolak was coated on a silicon wafer to have a thickness of 2.0 μm and heated at 200° C. for 30 minutes to form a flattening layer.

The photosensitive resin solution was coated on the flattening layer to have a thickness of 0.6 μm and prebaked at 90° C. for five minutes to form a resist film. The formed resist film was exposed by using 248 nm KrF excimer laser light (200 mJ/cm$^2$). Thereafter, the resist film was dipped and developed in an aqueous TMAH solution having a concentration of 1.0 wt % for one minute to form a resist pattern.

The resist pattern was used as a mask to etch the flattening layer by oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 31

70 g of polysiloxane represented by a formula listed in Table 11 to be presented later, 30 g of a compound represented by a formula listed in the same table, and 15 g of 2-methyl benzoxazole were dissolved in 300 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 32

70 g of polysiloxane represented by a formula listed in Table 11 to be presented later, 30 g of a compound represented by a formula listed in the same table, and 15 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 33

70 g of a novolak represented by a formula listed in Table 11 to be presented later and synthesized from phenol having silicon on its side chain, 30 g of a compound represented by a formula listed in the same table, and 15 g of pyridine were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE. Note that an aqueous TMAH solution having a concentration of 3.0 wt % was used as a developing solution.

After oxygen RIE, a pattern section of the flattening layer was observed by a scanning electron microscope. As a result, the pattern had a sharp profile having a film thickness of 2.3 μm and a line width and a line interval of 0.3 μm.

EXAMPLE 34

70 g of poly(p-vinylphenol), 50 g of a compound represented by a formula listed in Table 11 to be presented layer, and 20 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 35

70 g of polysiloxane represented by a formula listed in Table 11 to be presented later, 30 g of a compound represented by a formula listed in the same table, and 15 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 36

70 g of polysiloxane represented by a formula listed in Table 11 to be presented later, 30 g of a compound represented by a formula listed in the same table, and 15 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 37

70 g of a novolak represented by a formula listed in Table 11 to be presented later and synthesized from phenol having silicon on its side chain, 30 g of a compound represented by a formula listed in the same table, and 15 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE. Note that an aqueous TMAH solution having a concentration of 3.0 wt % was used as a developing solution.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 38

70 g of polysiloxane represented by a formula listed in Table 11 to be presented later, 30 g of a compound represented by a formula listed in the same table, and 15 g of 2-methyl benzthiazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 39

70 g of polysiloxane represented by a formula listed in Table 11 to be presented later, 30 g of a compound represented by a formula listed in the same table, and 15 g of 2-methyl benzoxazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 40

70 g of a novolak represented by a formula listed in Table 11 to be presented later and synthesized from phenol having silicon on its side chain, 30 g of a compound represented by a formula listed in the same table, and 10 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE. Note that an aqueous TMAH solution having a concentration of 3.0 wt % was used as a developing solution.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 41

70 g of polysiloxane represented by a formula listed in Table 11 to be presented later, 30 g of a compound represented by a formula listed in the same table, and 15 g of 2-methyl benzthiazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE. Note that an aqueous TMAH solution having a concentration of 3.0 wt % was used as a developing solution.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 42

70 g of a novolak represented by a formula listed in Table 11 to be presented later and synthesized from phenol having silicon on its side chain, 30 g of a compound represented by a formula listed in the same table, and 10 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 43

70 g of polysiloxane represented by a formula listed in Table 11 to be presented later, 30 g of a compound represented by a formula listed in the same table, and 15 g of benzthiazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 44

70 g of polysiloxane represented by a formula listed in Table 11 to be presented later, 30 g of a compound represented by a formula listed in the same table, and 15 g of pyridine were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 45

70 g of polysiloxane represented by a formula listed in Table 11 to be presented later, 30 g of a compound represented by a formula listed in the same table, and 15 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 46

70 g of a novolak represented by a formula listed in Table 11 to be presented later and synthesized from phenol having silicon on its side chain, 30 g of a compound represented by a formula listed in the same table, and 15 g of 2-methyl benzthiazole were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE Note that an aqueous TMAH solution having a concentration of 3.0 wt % was used as a developing solution.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 47

70 g of poly(p-vinylphenol) represented by a formula listed in Table 11 to be presented later, 50 g of a compound represented by a formula listed in the same table and 20 g of tributylamine were dissolved in 400 g of ethyl cellosolve acetate. The resultant solution was filtered by a 0.2 μm thick fluoroplastic membrane filter to prepare a photosensitive resin solution.

Following the same procedures as in Example 30, a flattening layer was formed on a silicon wafer, a resist film was formed on the flattening layer and exposed and developed, and the flattening layer was subjected to oxygen RIE. Note that an aqueous TMAH solution having a concentration of 3.0 wt % was used as a developing solution.

After oxygen RIE, a pattern section of the flattening layer was observed by a scanning electron microscope. As a result, it was confirmed that the pattern had a sharp profile having a film thickness of 2 3 μm and a line width and a line interval of 0.3 μm.

EXAMPLE 48

75 g of an m,p-cresol novolak, 25 g of a compound represented by a formula listed in Table 12 to be presented later, and 15 g of 2-methyl benzthiazole were dissolved in 250 g of ethyl cellosolve acetate. The resultant solution was filtered by a 0.2 μm thick fluoroplastic membrane filter to prepare a photosensitive resin solution.

The prepared photosensitive resin solution was coated on a silicon wafer and dried on a hot plate at 90° C. for five minutes to form a 1.0 μm thick resist film. Subsequently, pattern exposure (200 mJ/cm$^2$) was performed for the resist film by a reduced projection exposure apparatus using KrF excimer laser light (248 nm). After pattern exposure, the resist film was heated on a hot plate at 110° C. for two minutes. Thereafter, the entire surface of the resist film was exposed (200 mJ/cm$^2$) by using a mercury lamp. After entire-surface exposure, the resist film was dipped and developed in an aqueous TMAH solution having a concentration of 2.38 wt % for one minute to form a negative pattern.

EXAMPLE 49

70 g of poly(p-vinylphenol), 25 g of a compound represented by a formula listed in Table 12 to be presented later, and 20 g of tributylamine were dissolved in 250 g of ethyl cellosolve acetate. The resultant solution was filtered by a 0.2 μm thick fluoroplastic filter to prepare a photosensitive resin solution.

Following the same procedures as in Example 48, the photosensitive resin solution wa coated and dried on a silicon wafer to form a resist film, and the resist film was subjected to pattern exposure, a heating treatment, entire-surface exposure and development, thereby forming a negative pattern. Note that the drying temperature of the photosensitive resin solution was 100° C., pattern exposure was performed at 250 mJ/cm$^2$, the heating temperature was 120° C., and entire-surface exposure was performed at 150 mJ/cm$^2$.

EXAMPLE 50

70 g of poly(p-vinylphenol), 25 g of a compound represented by a formula listed in Table 12 to be presented later, and 20 g of imidazole were dissolved in 250 g of ethyl cellosolve acetate. The resultant solution was filtered by a 0.2 μm thick fluoroplastic filter to prepare a photosensitive resin solution.

Following the same procedures as in Example 48, the photosensitive resin solution was coated and dried on a silicon wafer to form a resist film, and the resist film was subjected to pattern exposure, a heating treatment, entire-surface exposure and development, thereby forming a negative pattern. Note that the heating treatment was performed at 140° C. for one minute, and entire-surface exposure was performed at 100 mJ/cm$^2$.

EXAMPLE 51

70 g of poly(p-vinylphenol), 25 g of a compound represented by a formula listed in Table 12 to be presented later, and 20 g of 2-methyl benzoxazole were dissolved in 250 g of ethyl cellosolve acetate. The resultant solution was filtered by a 0.2 μm thick fluoroplastic filter to prepare a photosensitive resin solution.

Following the same procedures as in Example 48, the photosensitive resin solution was coated and dried on a silicon wafer to form a resist film, and the resist film was subjected to pattern exposure, a heating treatment, entire-surface exposure and development, thereby forming a negative pattern. Note that the drying temperature of the photosensitive resin solution was 80° C., pattern exposure was performed at 250 mJ/cm$^2$, the heating treatment was performed at 120° C. for one minute, and entire-surface exposure was performed at 150 mJ/cm$^2$.

The shape of the negative pattern obtained in each of Examples 48 to 51 was checked. The results are summarized in Table 12.

As is apparent from Table 12, in each of Examples 48 to 51, a fine, rectangular and highly precise negative pattern was formed.

EXAMPLE 52

70 g of a novolak represented by a formula listed in Table 13 to be presented later and synthesized from phenol having silicon on its side chain, 30 g of a compound represented by a formula listed in the same table and 10 g of 2-methyl benzimidazole were dissolved in 400 g of ethyl cellosolve acetate. The resultant solution was filtered by a 0.2 μm thick fluoroplastic membrane filter to prepare a photosensitive resin solution.

Independently, a solution of polymer material consisting of a commercially available novolak was coated on a silicon substrate to have a thickness of 2.0 pm and heated at 200° C. for 30 minutes to form a flattening layer.

The photosensitive resin solution was coated on the flattening layer and dried at 90° C. for two minutes. Thereafter, pattern exposure (200 mJ/cm$^2$) was performed by using KrF excimer laser light (248 nm), a heating treatment was performed at 110° C. for two minutes, and entire-surface exposure (200 mJ/cm$^2$) was performed by using a mercury lamp. After entire-surface exposure, development was performed by using an aqueous TMAH solution having a concentration of 3.0 wt % to form a negative pattern (upper pattern).

The silicon substrate having the upper pattern thereon was placed in a dry etching apparatus (HIRRIE (tradename): available from Tokuda Seisakusho K.K.), and the upper layer was used as a mask to perform etching of the underlying flattening layer by RIE using an oxygen plasma. This etching was performed under the conditions of an output of 0.8 W/cm$^2$, an oxygen gas pressure of 4 pa, and a flow rate of 50 SCCM.

EXAMPLE 53

70 g of polysiloxane represented by a formula listed in Table 13 to be presented later, 30 g of a compound represented by a formula listed in the same table, and 10 g of 2-methyl benzthiazole were dissolved in 250 g of ethyl cellosolve acetate. The resultant solution was filtered by a 0.2 μm thick fluoroplastic membrane filter to prepare a photosensitive resin solution.

Following the same procedures as in Example 52, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying time of the photosensitive resin solution was five minutes, pattern exposure was performed at 150 mJ/cm$^2$, the heating treatment was performed at 140° C. for one minute, entire-surface exposure was performed at 100 mJ/cm$^2$, and an aqueous TMAH solution having a concentration of 2.38 wt % was used as a developing solution.

EXAMPLE 54

70 g of polysiloxane represented by a formula listed in Table 13 to be presented later, 30 g of a compound represented by a formula listed in the same table, and 10 g of imidazole were dissolved in 250 g of ethyl cellosolve acetate. The resultant solution was filtered by a 0.2 μm thick fluoroplastic membrane filter to prepare a photosensitive resin solution.

Following the same procedures as in Example 52, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that drying of the photosensitive resin solution was performed at 80° C. for five minutes, pattern exposure was performed at 250 mJ/cm$^2$, the heating treatment was performed at 120° C. for one minute, entire-surface exposure was performed at 100 mJ/cm$^2$, and an aqueous TMAH solution having a concentration of 2.38 wt % was used as a developing solution.

The pattern shape of the flattening layer after oxygen RIE obtained in each of Examples 52 to 54 was observed by a scanning electron microscope. The results are summarized in Table 13. Note that numerals in Table 13 represent a line width and a line interval and a corresponding film thickness was 2.3 μm.

As is apparent from Table 13, in each of Example 52 to 54, a two-layered pattern having a fine line width and a fine line interval of 0.25 μm and a sharp pattern profile was formed.

EXAMPLE 55

70 g of poly(p-vinylphenol), 50 g of a silicon-containing compound represented by a formula listed in Table 14 to be presented later, and 20 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 52, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying time of the photosensitive resin solution was five minutes, and an aqueous TMAH solution having a concentration of 1.0 wt % was used as a developing solution.

EXAMPLE 56

70 g of poly(p-vinylphenol), 50 g of a silicon-containing compound represented by a formula listed in Table 14 to be presented later, and 20 g of 2-methyl benzthiazole were dissolved in 400 g of ethyl cellosolve acetate. The resultant solution was filtered by a 0.2 μm thick fluoroplastic membrane filter to prepare a photosensitive resin solution.

Following the same procedures as in Example 52, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying time of the photosensitive resin solution was five minutes, the heating treatment after pattern exposure was performed at 140° C. for one minute, entire-surface exposure was performed at 100 mJ/cm$^2$, and an aqueous TMAH solution having a concentration of 1.0 wt % was used as a developing solution.

EXAMPLE 57

70 g of poly(p-vinylphenol), 50 g of a silicon-containing compound represented by a formula listed in Table 14 to be presented later, and 20 g of 2-methyl benzimidazole were dissolved in 400 g of ethyl cellosolve acetate. The resultant solution was filtered by a 0.2 μm thick fluoroplastic membrane filter to prepare a photosensitive resin solution.

Following the same procedures as in Example 52, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying time of the photosensitive resin solution was five minutes, pattern exposure was performed at 250 mJ/cm$^2$, the heating treatment after pattern exposure was performed at 120° C. for one minute, and an aqueous TMAH solution having a concentration of 1.0 wt % was used as a developing solution.

The pattern shape of the flattening layer after oxygen RIE obtained in each of Examples 55 to 57 was observed by a scanning electron microscope. The results are summarized in Table 14. Note that numerals in Table 14 represent a line width and a line interval and a corresponding film thickness was 2.3 μm.

As is apparent from Table 14, in each of Examples 55 to 57, a two-layered pattern having a fine line width and a fine line interval of 0.25 μm and a sharp pattern profile was formed.

EXAMPLE 58

70 g of polysiloxane represented by a formula listed in Table 15 to be presented later, 30 g of a silicon-containing compound represented by a formula listed in the same table, and 15 g of 2-methyl benzthiazole were dissolved in 400 g of ethyl cellosolve acetate. The resultant solution was filtered by a 0.2 μm thick fluoroplastic membrane filter to prepare a photosensitive resin solution.

Following the same procedures as in Example 52, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying time of the photosensitive resin solution was five minutes, and an aqueous TMAH solution having a concentration of 1.0 wt % was used as a developing solution.

EXAMPLE 59

70 g of a novolak represented by a formula listed in Table 15 to be presented later and synthesized from phenol having silicon on its side chain, 30 g of a silicon-containing compound represented by a formula listed in the same table, and 15 g of tributylamine were dissolved in 400 g of ethyl cellosolve acetate. The resultant solution was filtered by a 0.2 μm thick fluoroplastic membrane filter to prepare a photosensitive resin solution.

Following the same procedures as in Example 52, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying time of the photosensitive resin solution was five minutes.

EXAMPLE 60

70 g of polysiloxane represented by a formula listed in Table 15 to be presented later, 30 g of a silicon-containing compound represented by a formula listed in the same table, and 10 g of benzthiazole were dissolved in 250 g of ethyl cellosolve acetate. The resultant solution was filtered by a 0.2 μm thick fluoroplastic membrane filter to prepare a photosensitive resin solution.

Following the same procedures as in Example 52, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that the drying time of the photosensitive resin solution was five minutes, pattern exposure was performed at 250 mJ/cm$^2$, the heating treatment after pattern exposure was performed at 120° C. for one minute, entire-surface exposure was performed at 100 mJ/cm$^2$, and an aqueous TMAH solution having a concentration of 1.0 wt % was used as a developing solution.

EXAMPLE 61

70 g of polysiloxane represented by a formula listed in Table 15 to be presented later, 30 g of a silicon-containing compound represented by a formula listed in the same table, and 10 g of 2-methyl benzimidazole were dissolved in 250 g of ethyl cellosolve acetate. The resultant solution was filtered by a 0.2 μm thick fluoroplastic membrane filter to prepare a photosensitive resin solution.

Following the same procedures as in Example 52, a flattening layer was formed on a silicon substrate, the photosensitive resin solution was coated and dried on the flattening layer to form a resist film, the resist film was subjected to pattern exposure, a heating treatment, entire-surface exposure and development, and the flattening layer was subjected to oxygen RIE. Note that drying of the photosensitive resin solution was performed at 80° C. for five minutes, pattern exposure was performed at 300 mJ/cm$^2$, the heating treatment after pattern exposure was performed at 140° C. for one minute, entire-surface exposure was performed at 100 mJ/cm$^2$, and an aqueous TMAH solution having a concentration of 1.0 wt % was used as a developing solution.

The pattern shape of the flattening layer after oxygen RIE obtained in each of Examples 58 to 61 was observed by a scanning electron microscope. The results are summarized in Table 15. Note that numerals in Table 15 represent a line width and a line interval and a corresponding film thickness was 2.3 μm.

As is apparent from Table 15, in each of Examples 58 to 61, a two-layered pattern having a fine line width and a fine line interval of 0.25 μm and a sharp pattern profile was formed.

EXAMPLE 62

70 g of poly(p-vinylphenol), 30 g of a compound represented by a formula listed in Table 16 to be presented later, and 1 g of diphenyliodonium trifluoromethanesulfonate were dissolved in 250 g of ethyl cellosolve acetate. The resultant solution was filtered by a 0.2 μm thick fluoroplastic membrane filter to prepare a photosensitive resin solution.

The prepared photosensitive resin solution was coated on a silicon wafer and dried on a hot plate at 90° C. for five minutes to form a 1.2 μm thick resist film. The resist film was exposed (30 mJ/cm$^2$) by a reduced projection exposure apparatus using KrF excimer laser light (248 nm). The exposed resist film was dipped and developed in an aqueous TMAH solution having a concentration of 1.19 wt % for one minute. As a result, a highly precise resist pattern having a line width of 0.3 μm and a rectangular sectional shape was formed.

EXAMPLE 63

75 g of m,p-cresol novolak, 25 g of a compound represented by a formula listed in Table 16 to be presented later, and 1 g of benzoin tosylate were dissolved in 250 g of ethyl cellosolve acetate. The resultant solution was filtered by a 0.2 μm thick fluoroplastic membrane filter to prepare a photosensitive resin solution.

Following the same procedures as in Example 62, a resist film was formed on a silicon wafer and exposed and developed. Note that an aqueous TMAH solution having a concentration of 2.38 wt % was used as a developing solution.

As a result, a highly precise resist pattern having a line width of 0.3 μm and a rectangular sectional shape was formed.

EXAMPLE 64

The photosensitive resin solution prepared in Example 62 was coated on an aluminum film formed on a silicon wafer, and a 0.3 μm wide resist pattern was formed following the same procedures as in Example 62.

The resist pattern was used as a mask to perform dry etching for an exposed aluminum film by using CBrCl$_3$ gas. As a result, the 0.3 μm wide resist pattern could be precisely transferred onto the aluminum film.

COMPARATIVE EXAMPLE 3

A polymethyl methacrylate solution was coated on an aluminum film formed on a silicon wafer, and a resist pattern was formed following the same procedures as in Example 62.

The resist pattern was used as a mask to perform dry etching for an exposed aluminum film by using CBrCl$_3$ gas. As a result, the polymethyl methacrylate pattern disappeared during etching of the aluminum film and therefore could not be transferred.

EXAMPLE 65

70 g of polysiloxane represented by a formula listed in Table 16 to be presented later, 30 g of a compound represented by a formula listed in the same table, and 1 g of triphenylsulfonium trifluoromethanesulfonate represented by a formula listed in the same table were dissolved in 400 g of ethyl cellosolve acetate. The resultant solution was filtered by a 0.2 μm thick fluoroplastic membrane filter to prepare a photosensitive resin solution.

Independently, a polymer material solution consisting of a commercially available novolak was coated on a silicon wafer to have a thickness of 2.0 μm and heated at 200° C. for 30 minutes to form a flattening layer.

The photosensitive resin solution was coated on the flattening layer to have a thickness of 0.6 μm and prebaked at 90° C. for five minutes to form a resist film. The formed resist film was exposed by using 248 nm KrF excimer laser light (50 mJ/cm²). Thereafter, the resist film was dipped and developed in an aqueous TMAH solution having a concentration of 1.0 wt % for on minute to form a resist pattern.

The resist pattern was used as a mask to etch the flattening layer by oxygen RIE.

After oxygen RIE, a pattern section of the flattening layer was observed by a scanning electron microscope. As a result, it was confirmed that the pattern had a sharp profile having a film thickness of 2.3 μm and a line width and a line interval of 0.3 μm.

EXAMPLE 66

180 g of poly(p-vinylphenol), 20 g of a compound represented by a formula listed in Table 16 to be presented later, and 5 g of diphenyliodonium trifluoromethanesulfonate represented by a formula listed in the same table were dissolved in 800 g of 1-acetoxy-2-ethoxyethane. The resultant solution was filtered by a 0.2 μm thick fluoroplastic membrane filter to prepare a photosensitive resin solution.

Independently, positive resist OFPR-5000 (tradename: available from TOKYO OHKA KOGYO CO., LTD.) comprising a novolak and a naphthoquinonediazide compound was spin-coated on a silicon wafer by using spinner and heated on a hot plate at 200° C. for 45 minutes, thereby forming a 1.5 μm thick flattening layer.

The photosensitive resin solution was spin-coated on the flattening layer by using a spinner and prebaked on a hot plate at 90° C. for 4.5 minutes to form a 0.5 μm thick resist film. Thereafter, the resist film was exposed (100 mJ/cm²) by using a reduced projection exposure apparatus using KrF excimer laser light (248 nm). After exposure, the resist film was dipped in an aqueous TMAH solution having a concentration of 1.19 wt % at 20° C. for one minute and washed by demineralized water for 30 seconds, thereby forming a resist pattern.

Thereafter, the resist pattern was used as a mask to etch the flattening layer by oxygen RIE.

After etching was performed by oxygen RIE, a pattern section of the flattening layer was observed by a scanning electron microscope. As a result, it was confirmed that the pattern had a sharp profile having a film thickness of 1.8 μm and a line width and a line interval of 0.3 μm.

EXAMPLE 67

180 g of poly(p-vinylphenol), 20 g of a compound represented by a formula listed in Table 16 to be presented later, and 5 g of triphenylsulfonium trifluoromethanesulfonate represented by a formula listed in the same table were dissolved in 800 g of 1-acetoxy-2-ethoxyethane. The resultant solution was filtered by a 0.2 μm thick fluoroplastic membrane filter to prepare a photosensitive resin solution.

Following the same procedures as in Example 66, a flattening layer was formed on a silicon wafer, the photosensitive resin solution was coated and dried on the flattening layer to form a resist film, the resist film was exposed and developed, and the flattening layer was subjected to oxygen RIE. Note that the resist film was exposed at 70 mJ/cm². As a result, a pattern sectional shape of the flattening layer had a sharp profile having a line width and a line interval of 0.3 μm.

EXAMPLE 68

180 g of m,p-cresol novolak, 20 g of a compound represented by a formula listed in Table 16 to be presented later, and 5 g of di(t-butylphenyl)iodonium trifluoromethanesulfonate represented by a formula listed in the same table were dissolved in 800 g of 1-acetoxy-2-ethoxyethane. The resultant solution was filtered by a 0.2 μm thick fluoroplastic membrane filter to prepare a photosensitive resin solution.

Following the same procedures as in Example 66, a flattening layer was formed on a silicon wafer, the photosensitive resin solution was coated and dried on the flattening layer to form a resist film, the resist film was exposed and developed, and the flattening layer was subjected to oxygen RIE. As a result, a pattern sectional shape of the flattening layer had a sharp profile having a line width and a line interval of 0.3 μm.

EXAMPLE 69

180 g of polysiloxane represented by a formula listed in Table 16 to be presented later, 20 g of a compound represented by a formula listed in the same table, and 5 g of triphenylsulfonium trifluoromethanesulfonate represented by a formula listed in the same table were dissolved in 800 g of 1-acetoxy-2-ethoxyethane. The resultant solution was filtered by a 0.2 thick fluoroplastic membrane filter to prepare a photosensitive resin solution.

Following the same procedures as in Example 66, a flattening layer was formed on a silicon wafer, the photosensitive resin solution was coated and dried on the flattening layer to form a resist film, the resist film was exposed and developed, and the flattening layer was subjected to oxygen RIE. Note that the resist film was exposed at 80 mJ/cm². As a result, a pattern sectional shape of the flattening layer had a sharp profile having a line width and a line interval of 0.3 μm.

Additional advantages and modifications will readily occur to those skilled in the art. Therefore, the invention in its broader aspects is not limited to the specific details, and illustrated examples shown and described. Accordingly, various modifications may be made without departing from the spirit or scope of the general inventive concept as defined by the appended claims and their equivalents.

TABLE 1

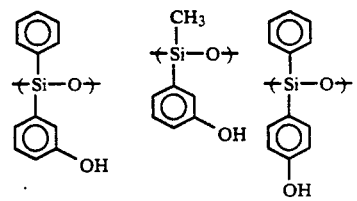

TABLE 1-continued
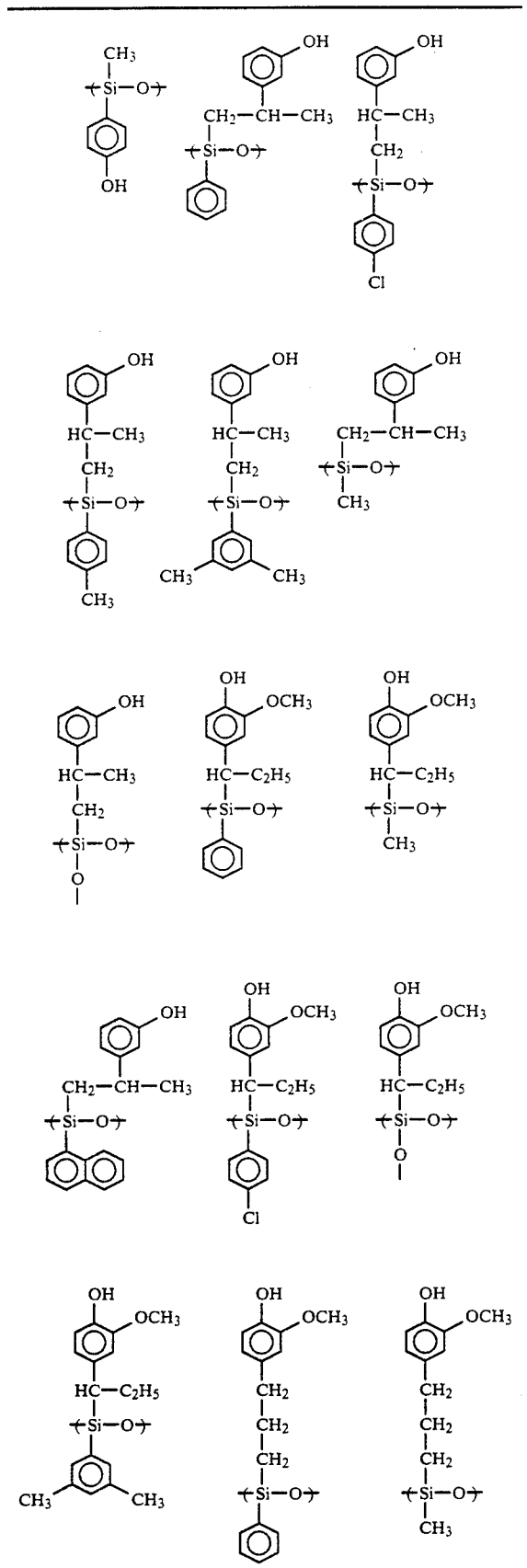
TABLE 1-continued
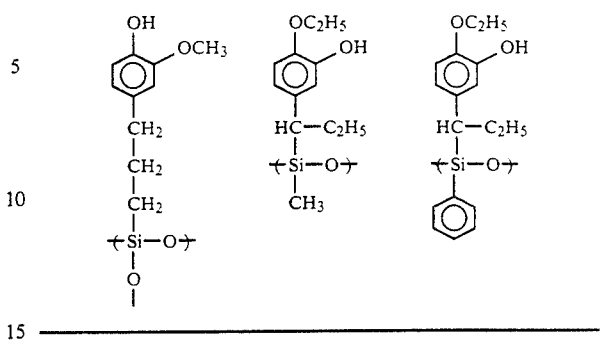
TABLE 2
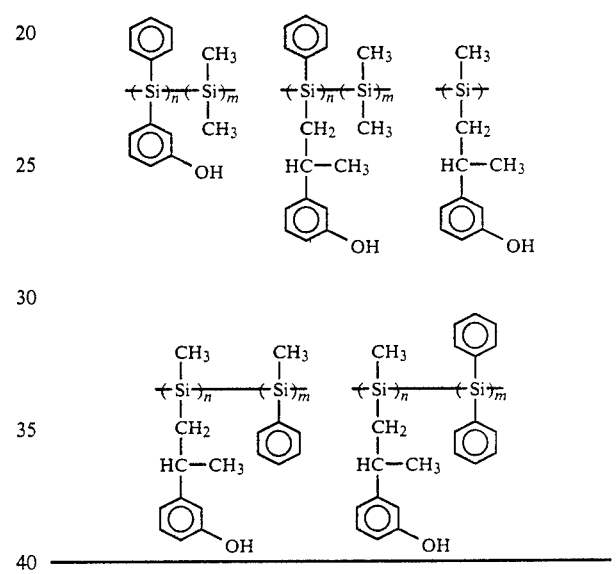
TABLE 3
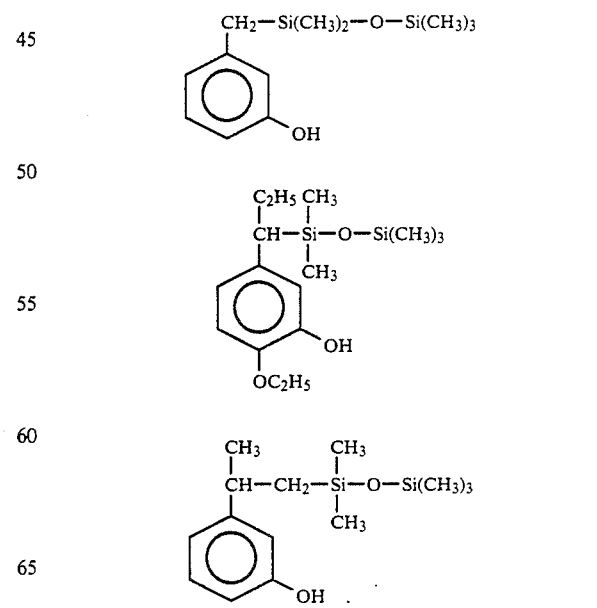

TABLE 3-continued
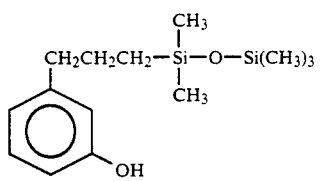
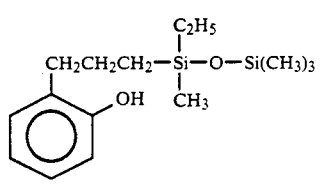
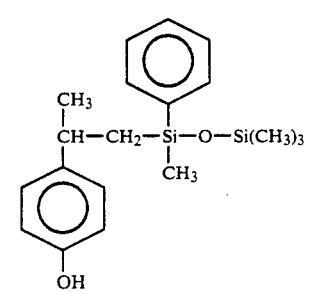
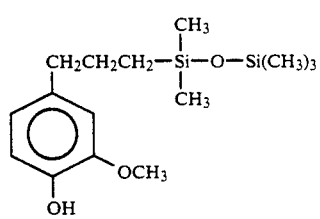
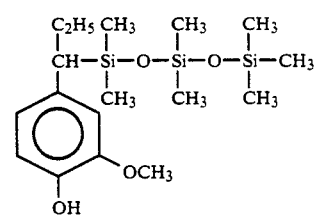
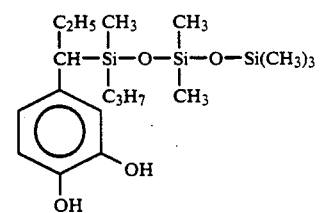
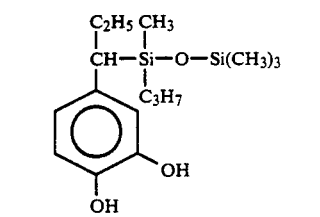
TABLE 3-continued
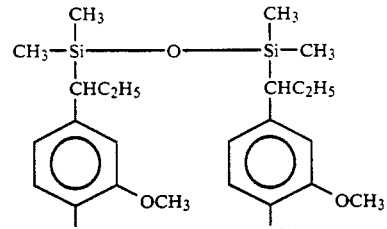
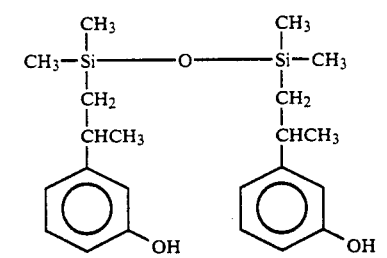
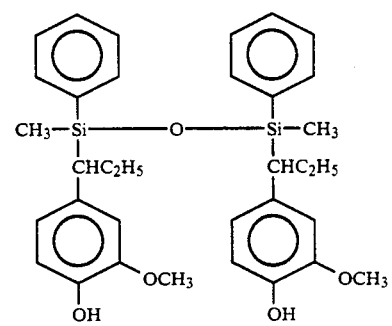
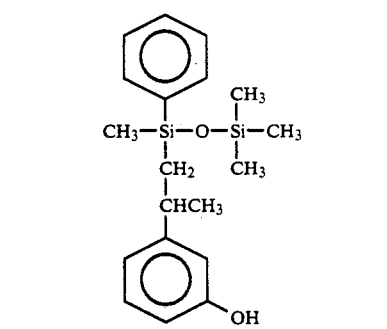
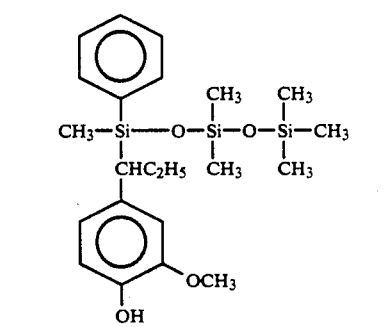
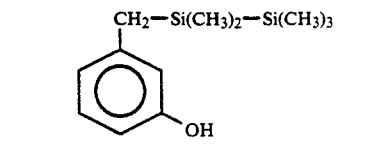

TABLE 3-continued
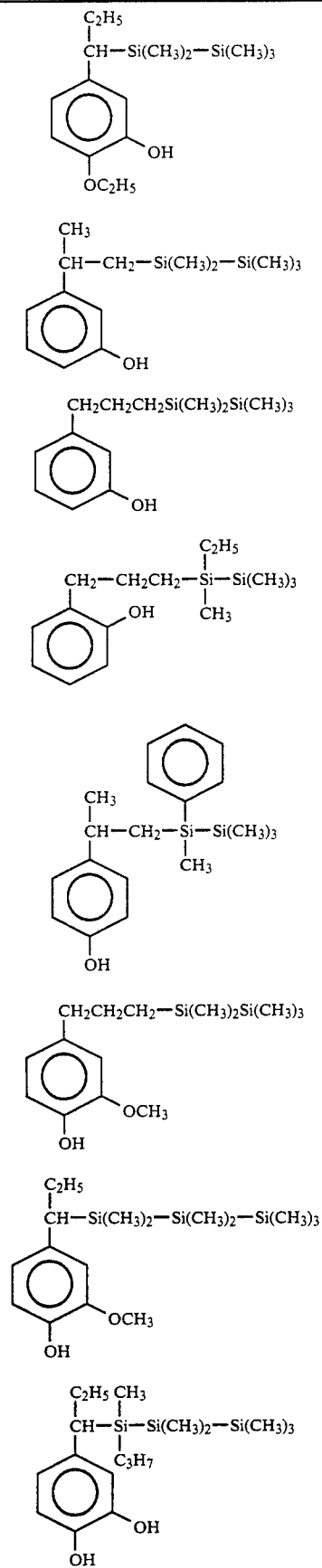
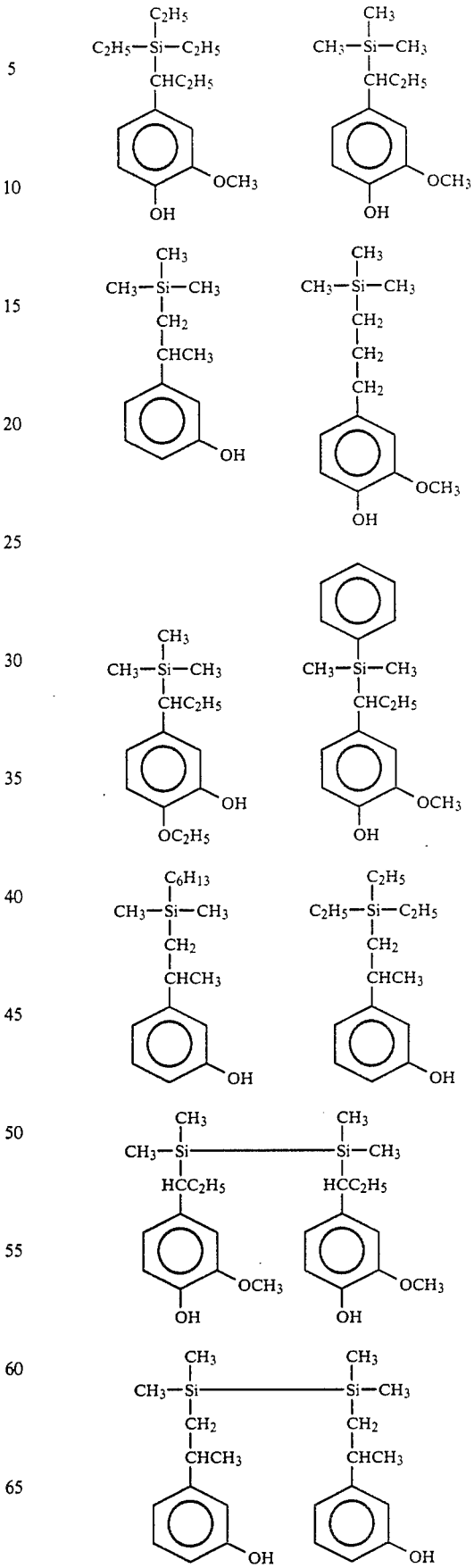

TABLE 3-continued
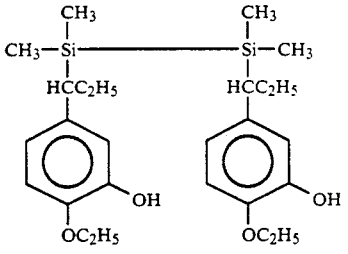
TABLE 4
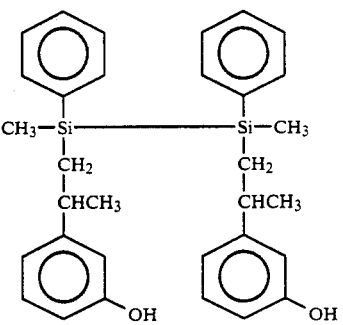
TABLE 4-continued

TABLE 4-continued
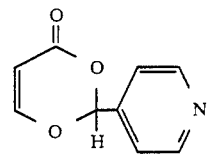
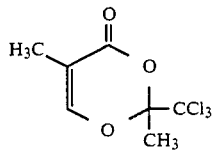
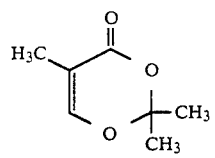
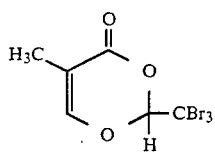
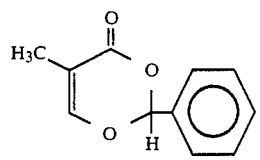
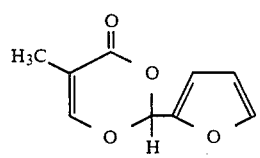
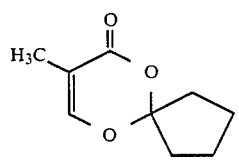
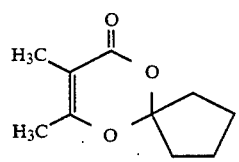
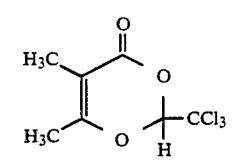
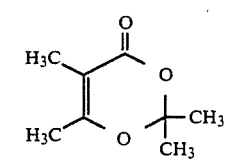
TABLE 4-continued
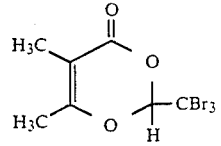
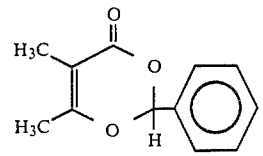
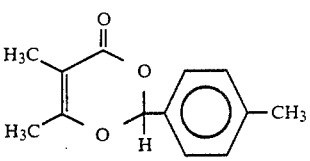
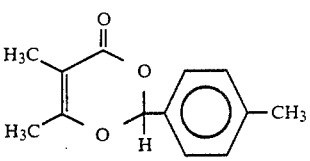
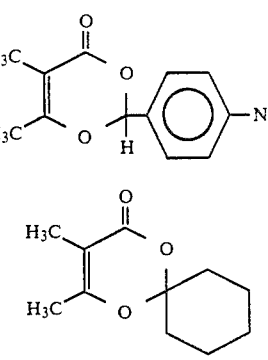
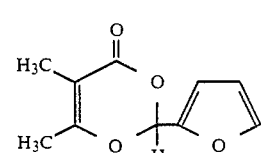
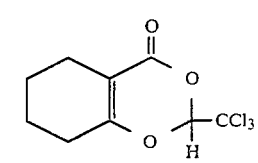
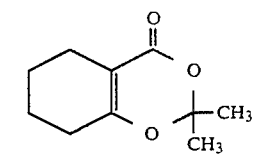
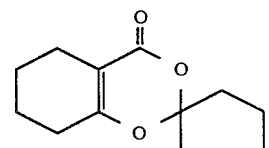
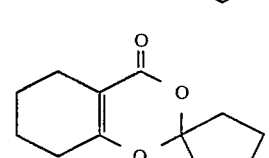

TABLE 4-continued
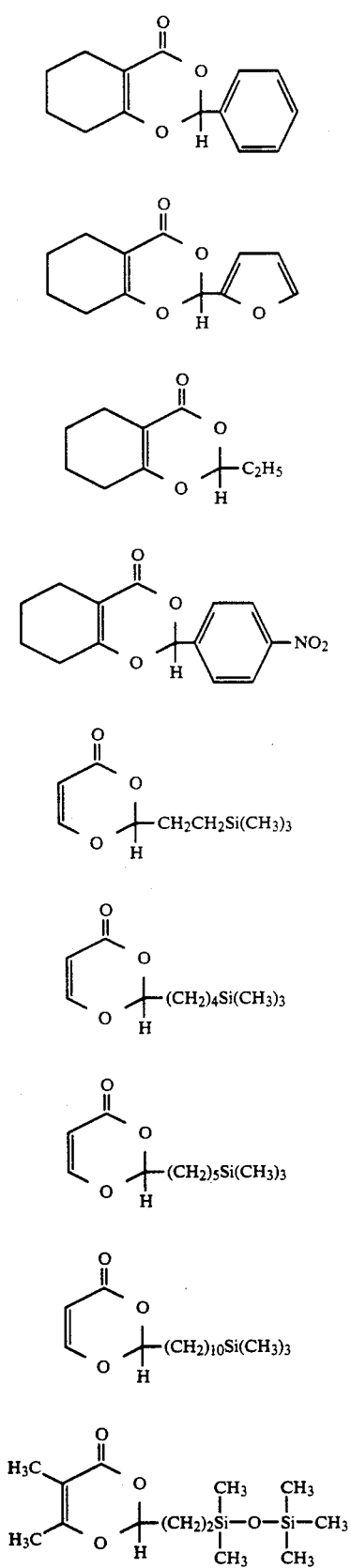
TABLE 4-continued
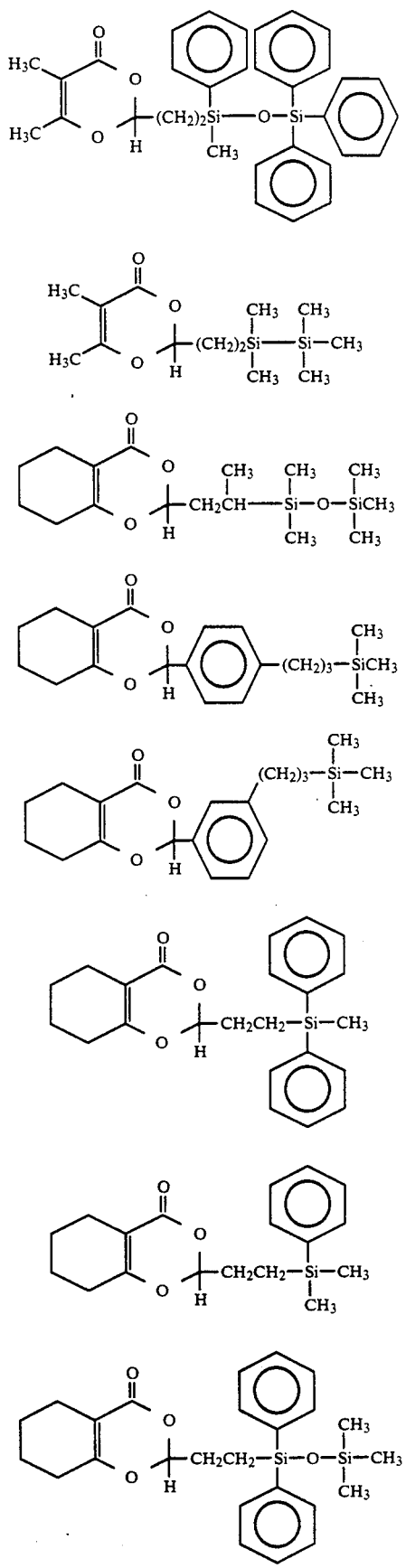

TABLE 4-continued
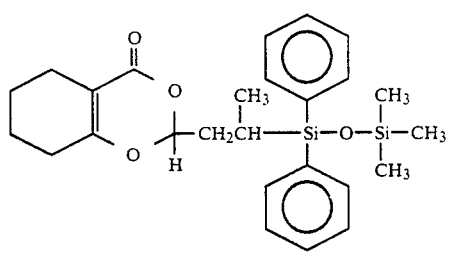
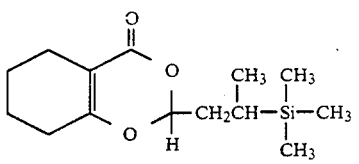
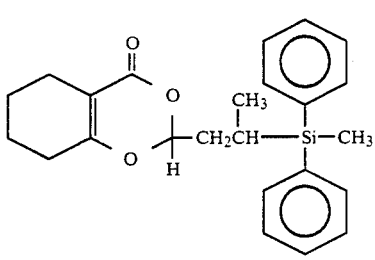
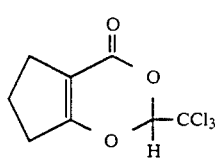
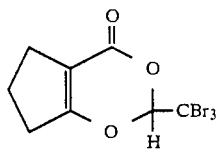
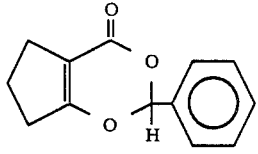
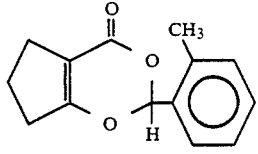
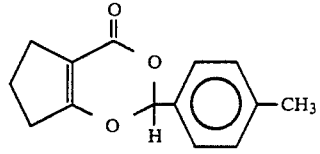
TABLE 4-continued
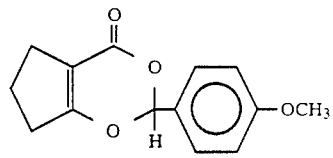
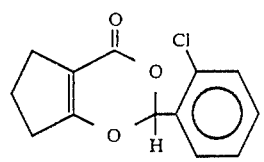
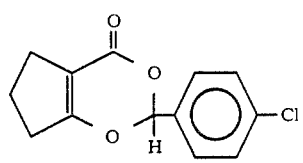
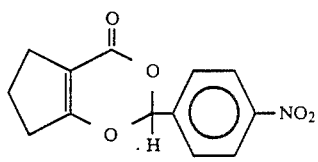
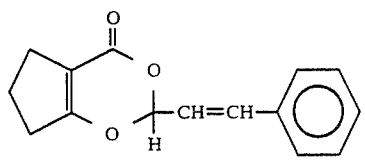
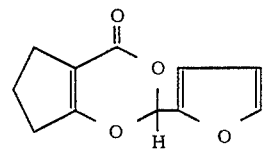
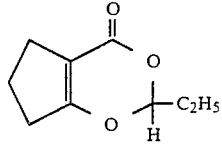
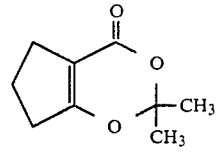
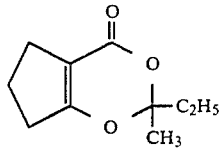
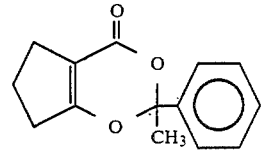

TABLE 4-continued
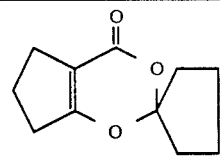
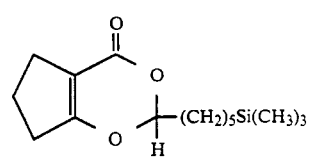
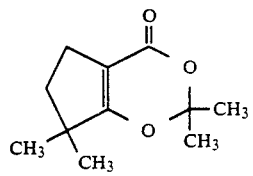
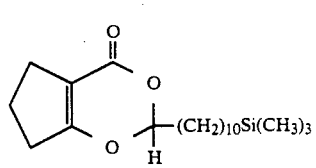
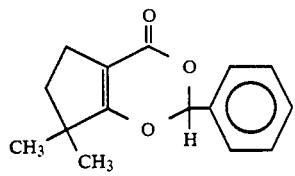
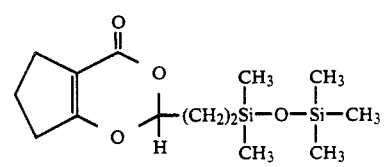
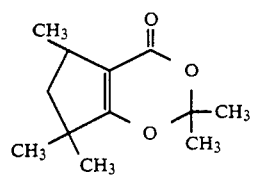
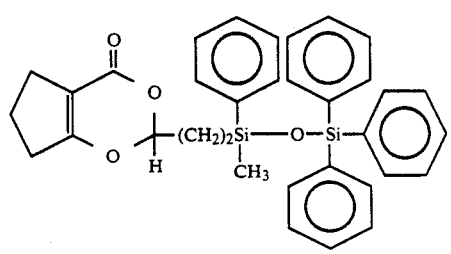
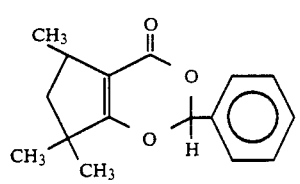
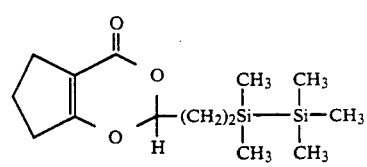
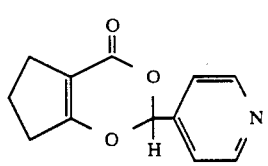
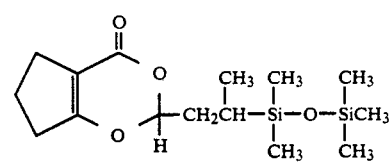
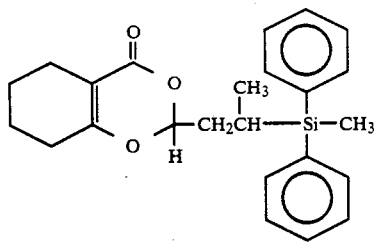
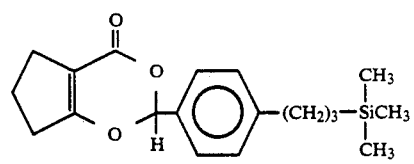
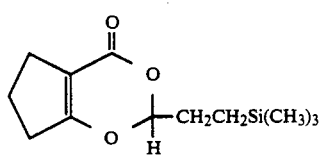
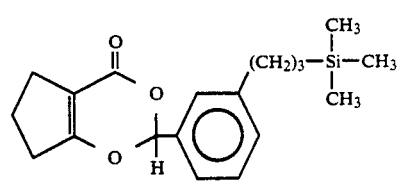
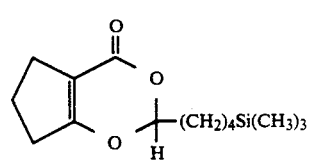

TABLE 4-continued
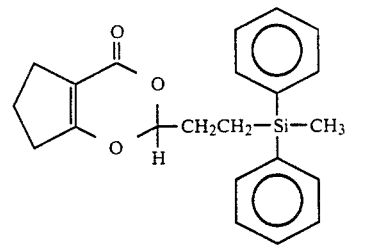
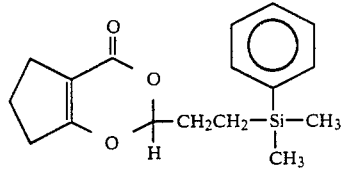
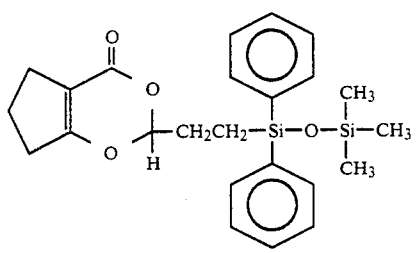
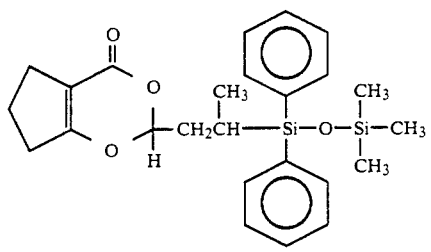
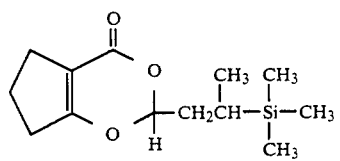
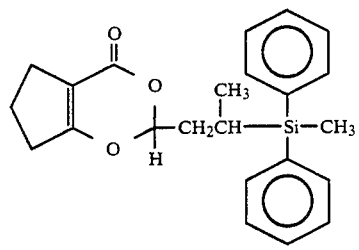
TABLE 5
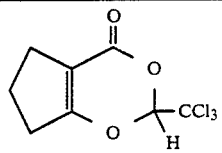
TABLE 5-continued
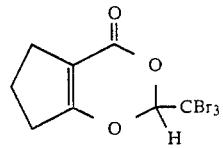
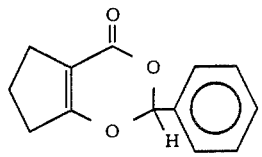
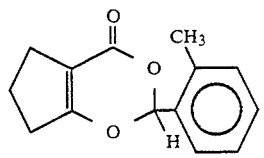
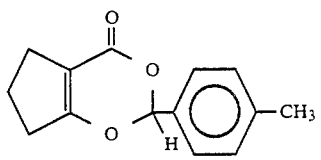
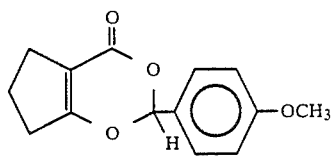
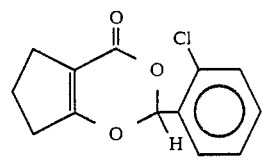
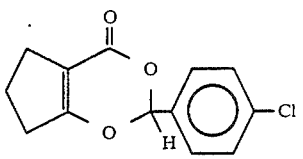
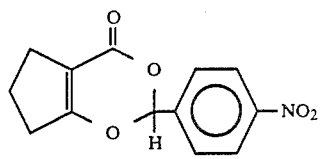
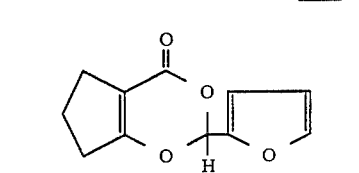

TABLE 5-continued
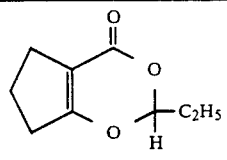
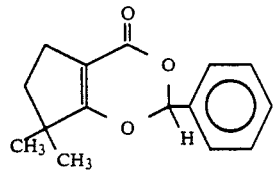
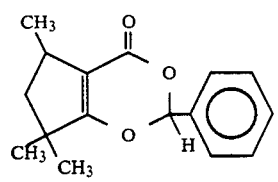
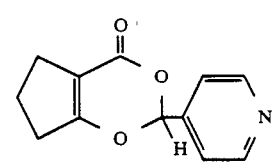
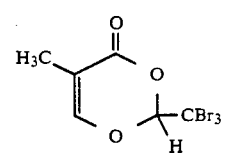
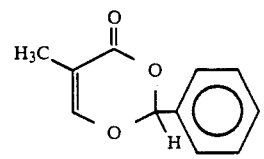
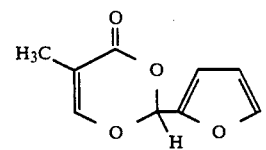
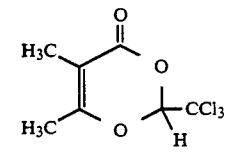
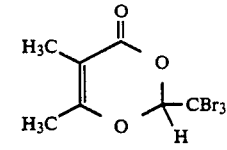
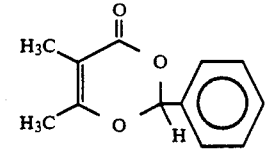
TABLE 5-continued
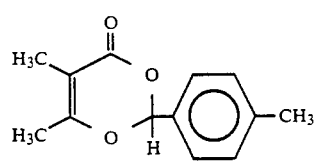
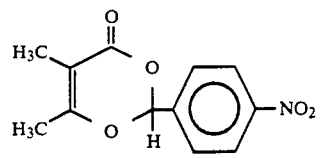
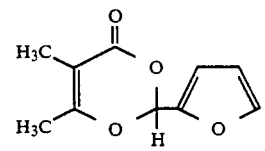
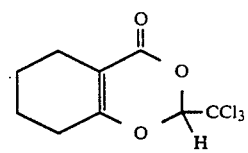
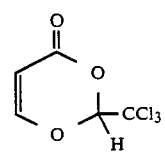
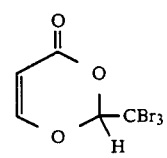
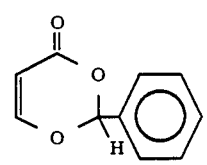
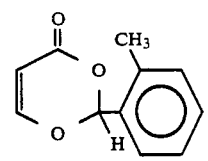
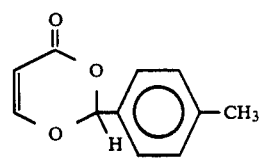
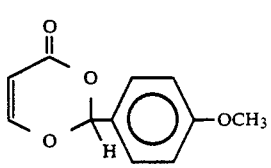

TABLE 5-continued
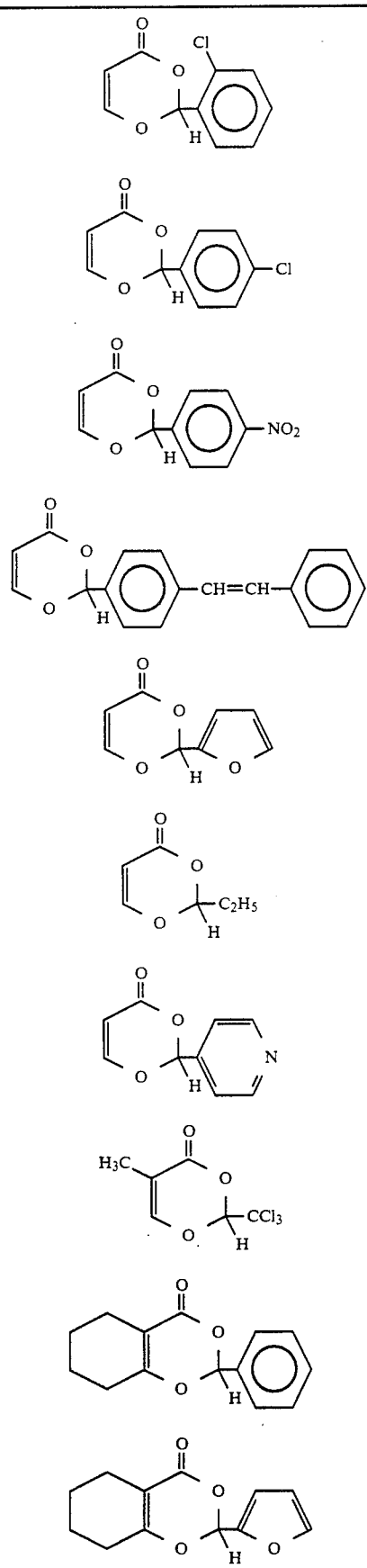
TABLE 5-continued
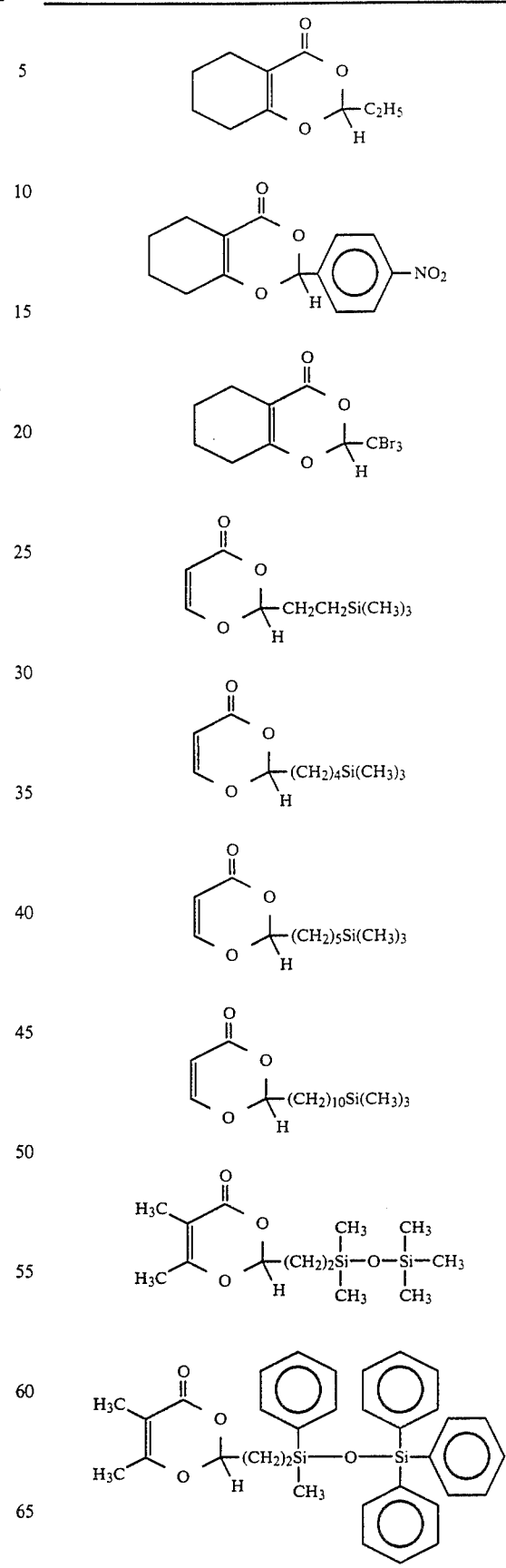

TABLE 5-continued
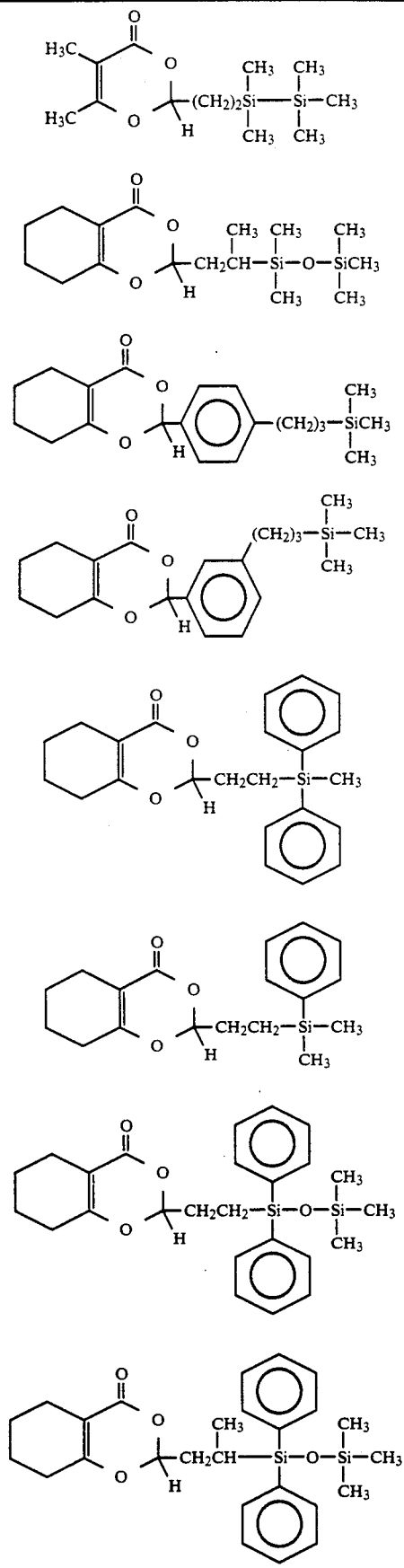
TABLE 5-continued
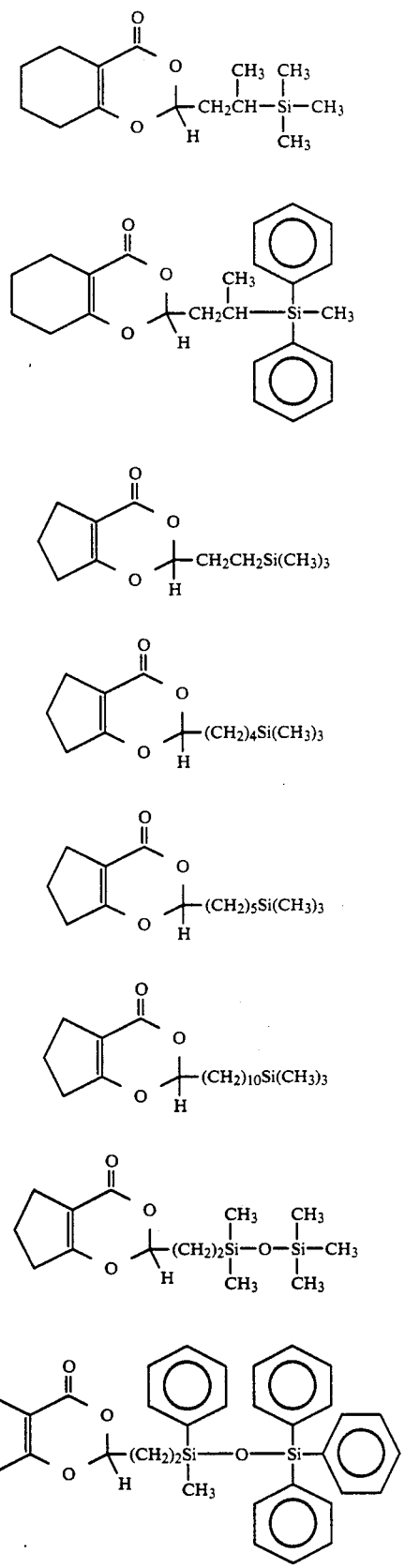

TABLE 5-continued
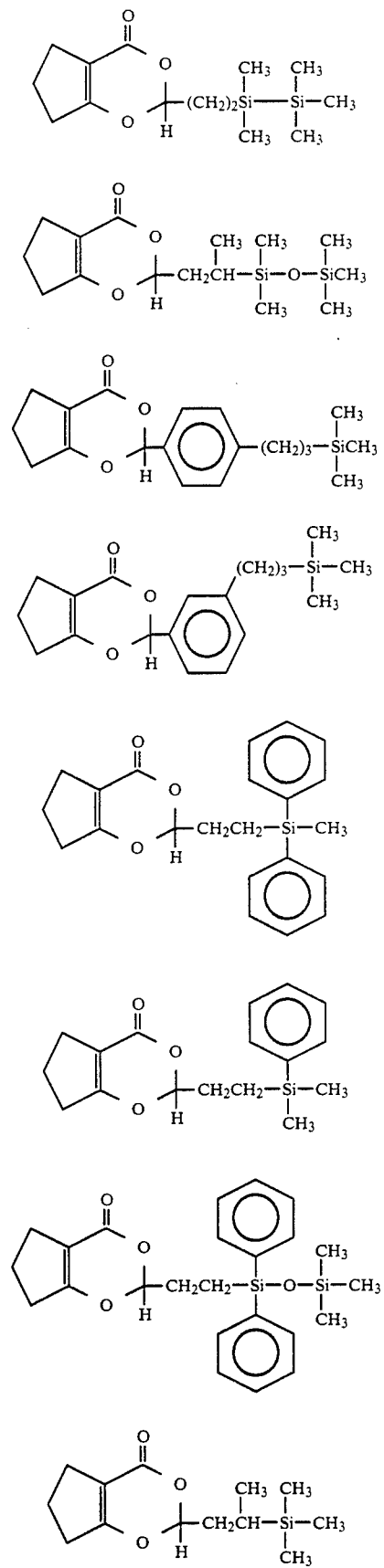
TABLE 5-continued
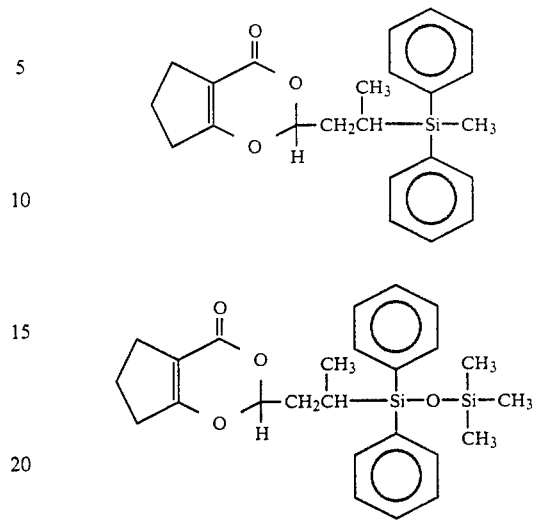
TABLE 6
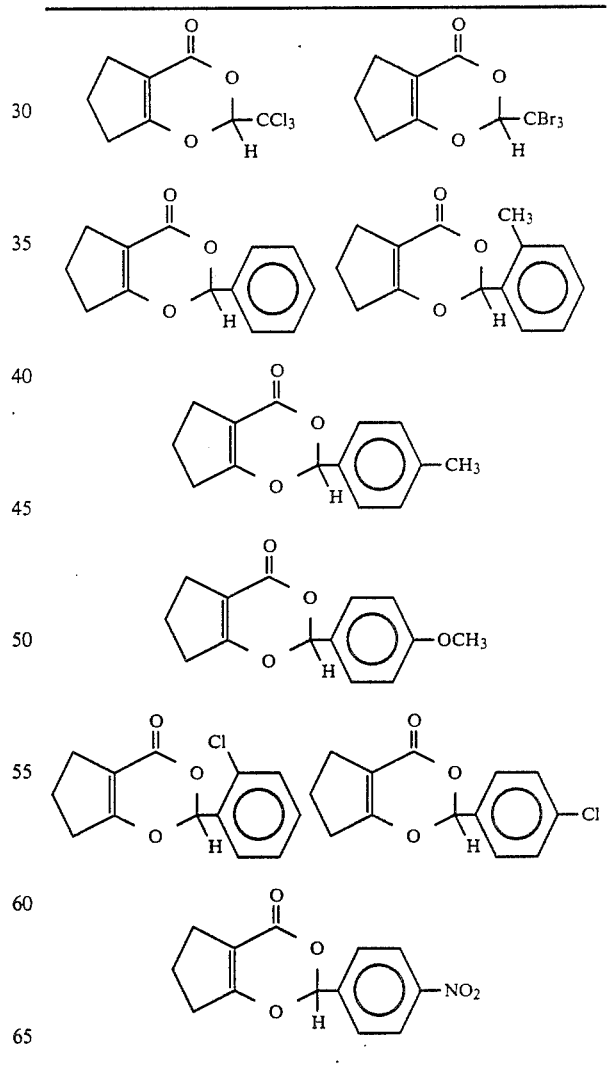

TABLE 6-continued
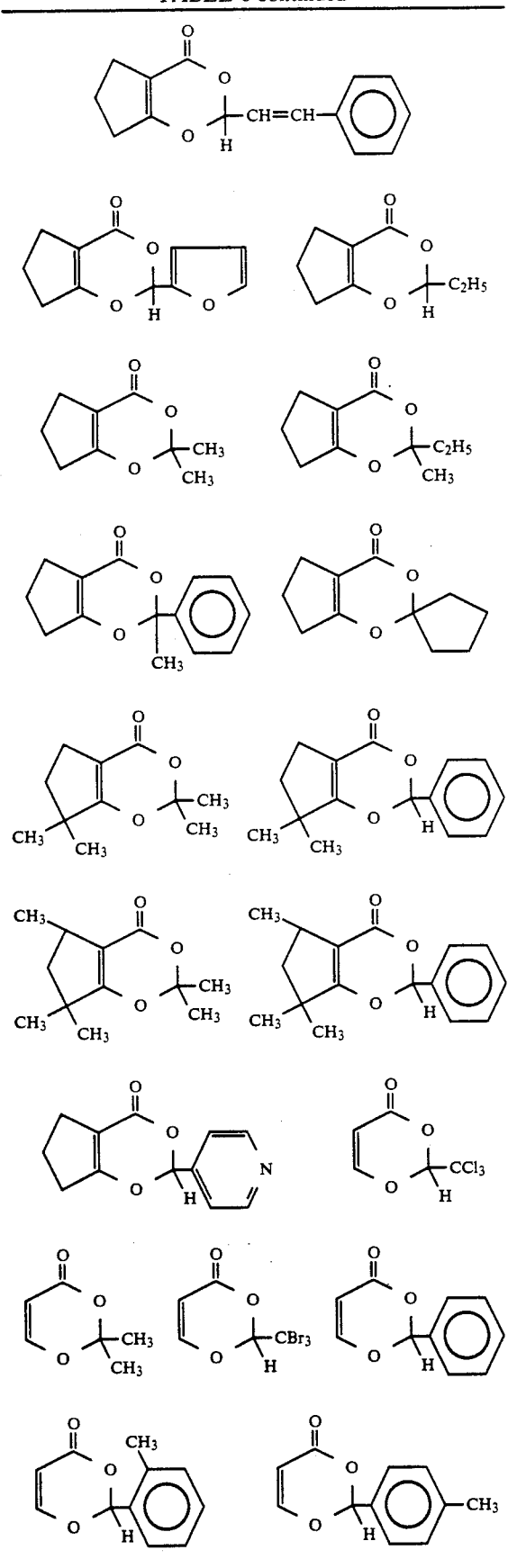
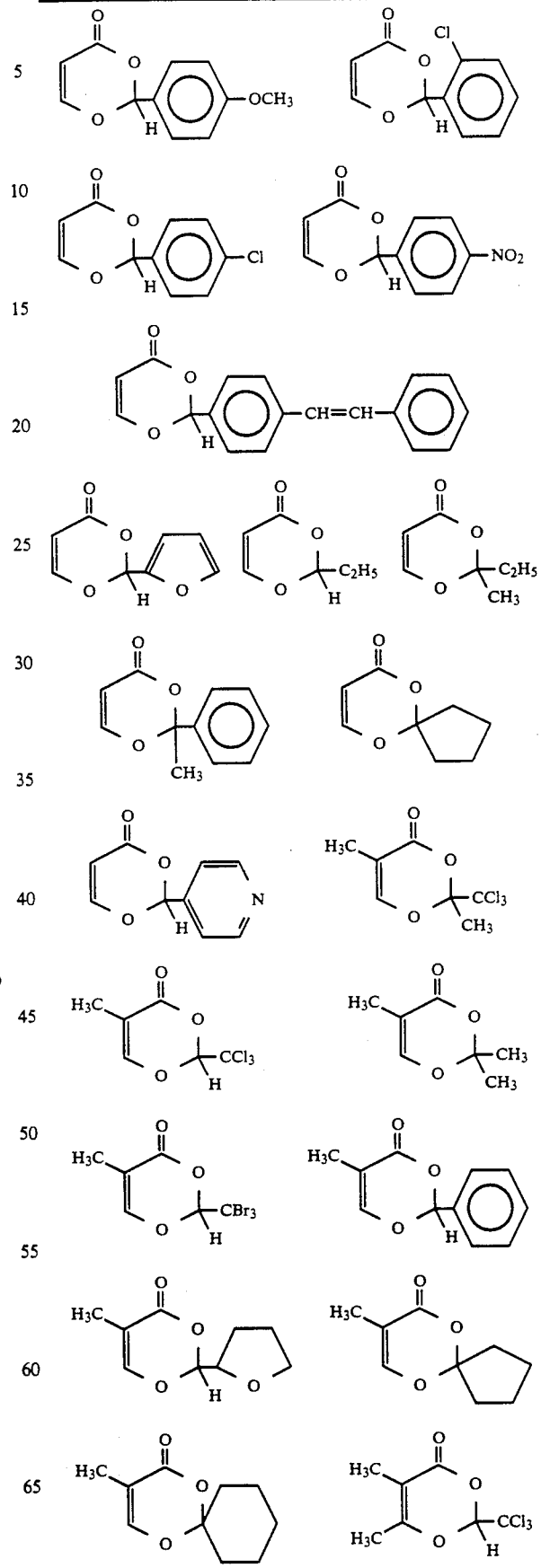

TABLE 6-continued
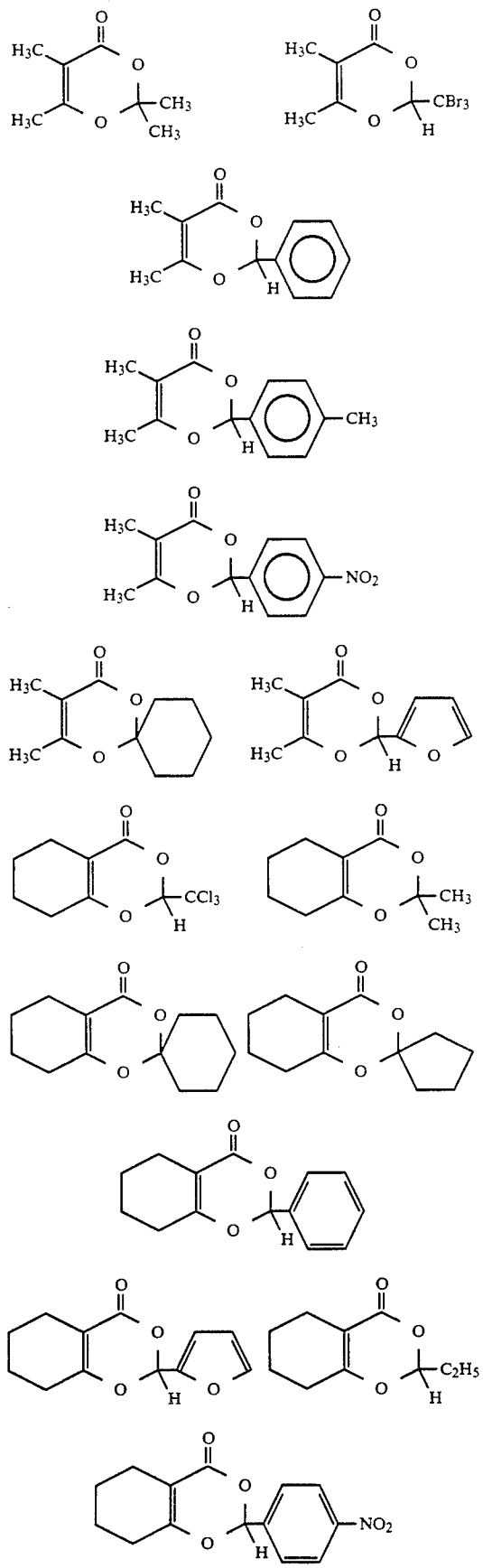
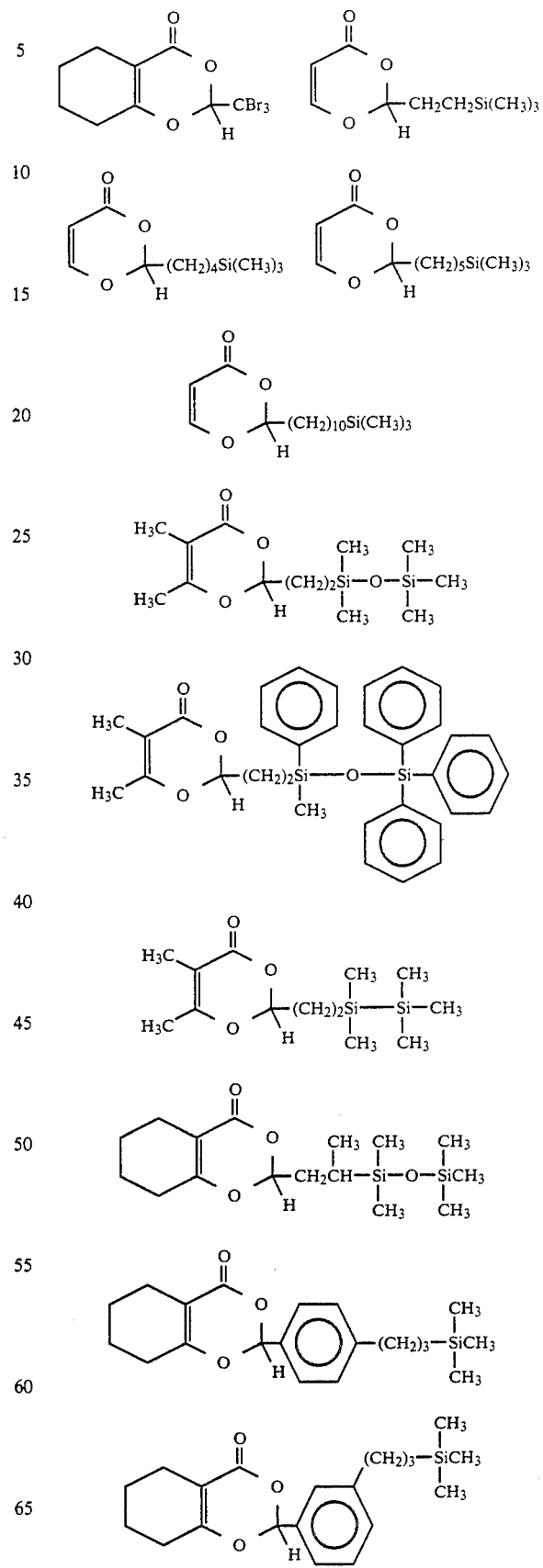

TABLE 6-continued
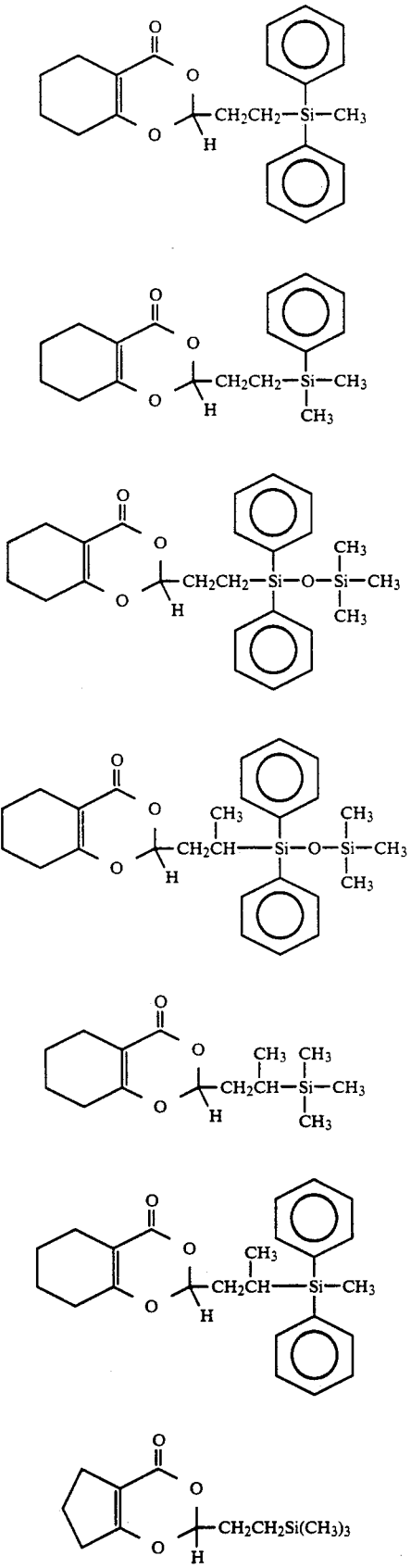
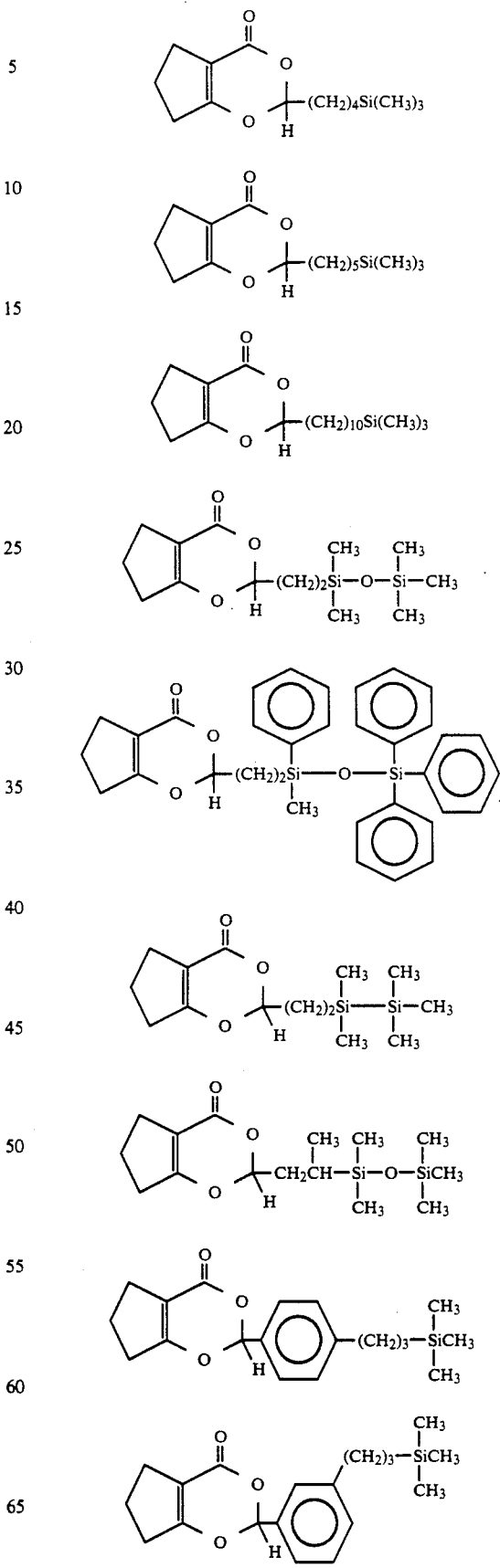

TABLE 6-continued
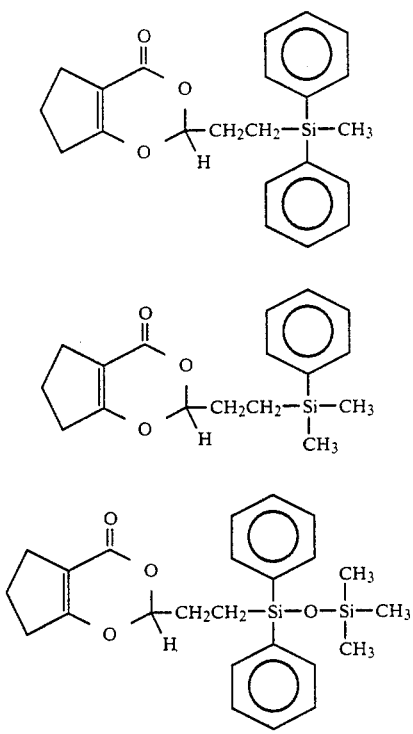
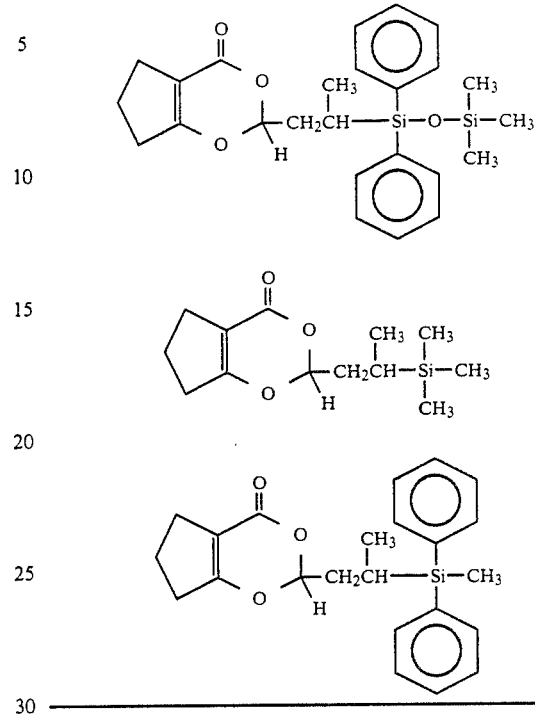
TABLE 7
| Example | Alkali-soluble Polymer | Compound represented by General Formula (I) or (II) |
|---|---|---|
| 1 | poly(p-vinyl phenol) | |
| 2 | m,p-cresol novolak | |
| 4 | | |

TABLE 7-continued

| Example | Alkali-soluble Polymer | Compound represented by General Formula (I) or (II) |
|---|---|---|
| 5 | (structure: siloxane copolymer with phenyl groups and CH₂-CH(CH₃)-phenyl-OH side chain, $(Si-O)_{50}(Si-O)_{50}$) | (structure: $H_3C$, $H_3C$ substituted vinyl ester with -O-CH(CH₃)- group) |
| 6 | (novolak-type polymer with CH₂-Si(CH₃)₂-O-Si(CH₃)₃ group, ratios 70/10/20) | (cyclohexene carboxylate with spiro cyclohexyl acetal) |
| 7 | $(Si-O)$ with two phenyl groups | ($H_3C$, $H_3C$ substituted vinyl ester with -O-CH₂CH₂Si(CH₃)₃ group) |
| 8 | (same as Example 5 siloxane copolymer) | ($H_3C$, $H_3C$ substituted vinyl ester with -O-CH-phenyl-(CH₂)₃Si(CH₃)₃ group) |
| 9 | (same as Example 6 novolak) | (cyclohexene carboxylate with -O-CH-(CH₂)₂-Si(CH₃)(phenyl)-O-Si(phenyl)₃ group) |
| 10 | poly(p-vinyl phenol) | (cyclohexene carboxylate with -O-CH-(CH₂)₂-Si(CH₃)₂-O-Si(CH₃)₃ group) |

TABLE 8

| Example | Alkali-soluble Polymer | Compound represented by General Formula | Shape of Pattern |
|---|---|---|---|
| 11 | poly(p-vinyl phenol) | 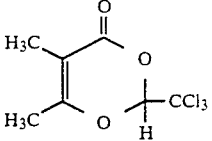 | rectangular shape of 0.28 μm width |
| 12 | m,p-cresol novolak | 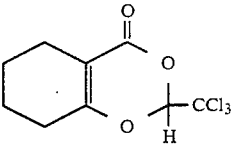 | rectangular shape of 0.28 μm width |
| 13 | m,p-cresol novolak | 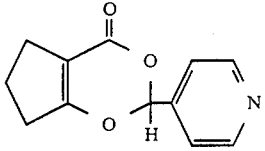 | rectangular shape of 0.28 μm width |
| 14 | m,p-cresol novolak | 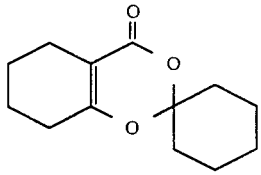 | rectangular shape of 0.28 μm width |

TABLE 9

| Example | Alkali-soluble Polymer | Compound represented by General Formula | Shape of Pattern |
|---|---|---|---|
| 15 | 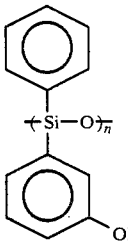 | 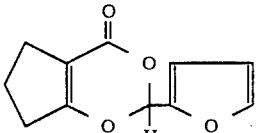 | sharp pattern profile of 0.28 μm width |
| 16 | 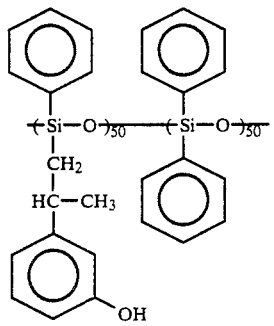 | 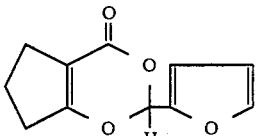 | sharp pattern profile of 0.28 μm width |

TABLE 9-continued

| Example | Alkali-soluble Polymer | Compound represented by General Formula | Shape of Pattern |
|---|---|---|---|
| 17 | 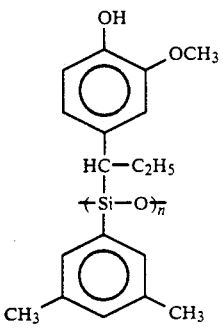 | 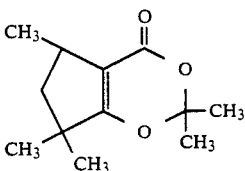 | sharp pattern profile of 0.28 μm width |
| 18 | 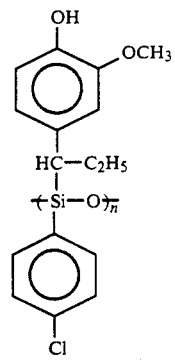 | 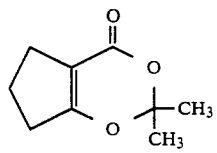 | sharp pattern profile of 0.28 μm width |

TABLE 10

| Example | Alkali-soluble Polymer | Compound represented by General Formula | Shape of Pattern |
|---|---|---|---|
| 19 | poly(p-vinyl phenol) | 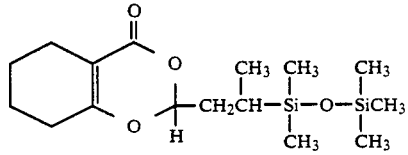 | sharp pattern profile of 0.28 μm width |
| 20 | poly(p-vinyl phenol) | 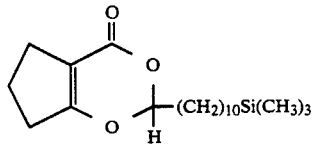 | sharp pattern profile of 0.28 μm width |
| 21 | 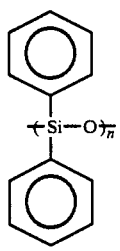 | 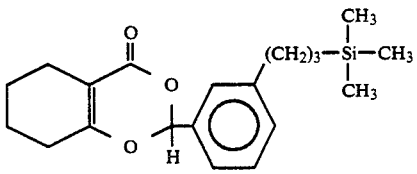 | sharp pattern profile of 0.28 μm width |

TABLE 10-continued
| Example | Alkali-soluble Polymer | Compound represented by General Formula | Shape of Pattern |
|---------|------------------------|----------------------------------------|------------------|
| 22 | 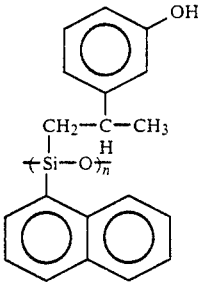 | 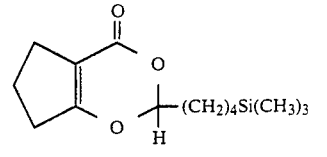 | sharp pattern profile of 0.28 μm width |

TABLE 11

| Example | Alkali-soluble Polymer | Compound represented by General Formula (III) | Basic Compound |
| --- | --- | --- | --- |
| 23 | poly(p-vinyl phenol) | ![structure with furan group] | 2-methyl benzimidazole |
| 24 | m,p-cresol novolak | ![structure with pyridine group] | 2-methyl benzimidazole |
| 25 | poly(p-vinyl phenol) | ![structure with CCl₃ group] | pyridine |
| 26 | m,p-cresol novolak | ![structure with CCl₃ group, cyclohexene ring] | 2-methyl benzimidazole |
| 27 | poly(p-vinyl phenol) | ![structure with CBr₃ group] | tributyl amine |
| 30 | ![polymer structure with Si-O backbone and phenol] | ![structure with silyl substituent] | 2-methyl benzthiazole |

TABLE 11-continued

| Example | Alkali-soluble Polymer | Compound represented by General Formula (III) | Basic Compound |
|---|---|---|---|
| 31 | phenyl-Si-O polymer with phenol-OH group | furan-methylidene dimethyl malonate structure | 2-methyl benzoxazole |
| 32 | siloxane polymer with phenol-OH group | 4-(trimethylsilylpropyl)phenyl-methylidene dimethyl malonate | 2-methyl benzimidazole |
| 33 | poly(vinyl phenol) derivative with –CH$_2$–Si(CH$_3$)$_2$–O–Si(CH$_3$)$_3$ groups | triphenylsilyl-substituted cyclohexenyl ester | pyridine |
| 34 | poly(p-vinyl phenol) | trimethylsilyl-substituted cyclohexenyl ester | 2-methyl benzimidazole |

TABLE 11-continued
| Example | Alkali-soluble Polymer | Compound represented by General Formula (III) | Basic Compound |
|---------|------------------------|-----------------------------------------------|----------------|
| 35 | 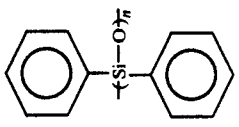 | 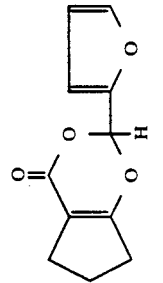 | 2-methyl benzimidazole |
| 36 | 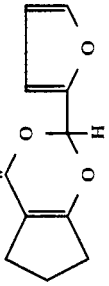 | 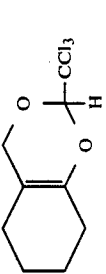 | 2-methyl benzimidazole |
| 37 |  | 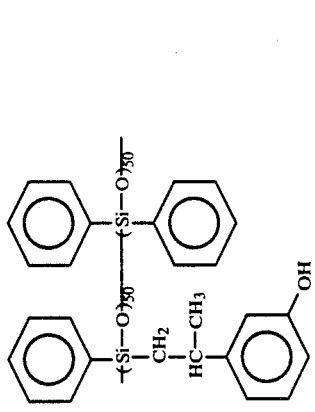 | 2-methyl benzimidazole |
| 38 | 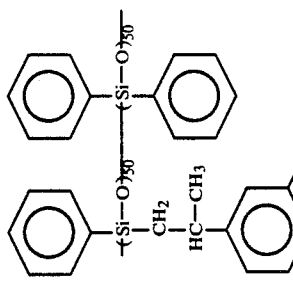 | 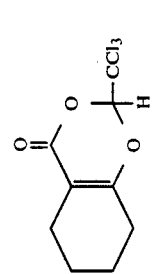 | 2-methyl benzthiazole |

TABLE 11-continued

| Example | Alkali-soluble Polymer | Compound represented by General Formula (III) | Basic Compound |
|---|---|---|---|
| 39 | (structure shown) | (structure shown) | 2-methyl benzoxazole |
| 40 | (structure shown) | (structure shown) | 2-methyl benzimidazole |
| 41 | (structure shown) | (structure shown) | 2-methyl benzthiazole |
| 42 | (structure shown) | (structure shown) | 2-methyl benzimidazole |

TABLE 11-continued

| Example | Alkali-soluble Polymer | Compound represented by General Formula (III) | Basic Compound |
|---|---|---|---|
| 43 | [structure] | [structure with CBr₃] | benzthiazole |
| 44 | [structure] | [structure with (CH₂)₂—Si(CH₃)₃] | pyridine |
| 45 | [structure] | [structure with (CH₂)₃—Si(CH₃)₃ on phenyl] | 2-methyl benzimidazole |

TABLE 11-continued

| Example | Alkali-soluble Polymer | Compound represented by General Formula (III) | Basic Compound |
|---|---|---|---|
| 46 | CH₂—Si(CH₃)₂—O—Si(CH₃)₃ with poly(hydroxy-methylphenyl) structure | cyclopentene carboxylate with (CH₂)₂Si(CH₃)–O–Si(C₆H₅)₃ substituent | 2-methyl benzthiazole |
| 47 | poly(p-vinyl phenol) | cyclopentene carboxylate with (CH₂)₂Si(CH₃)₂–O–Si(CH₃)₃ substituent | tributyl amine |

TABLE 12

| Example | Alkali-soluble Polymer | Compound represented by General Formula | Basic Compound | Shape of Pattern |
|---|---|---|---|---|
| 48 | m,p-cresol novolak | (structure with cyclopentene, C(=O)O-CH(O-)-furan) | 2-methyl benzthiazole | rectangular shape of 0.25 μm width |
| 49 | poly(p-vinyl phenol) | (structure with H₃C, H₃C groups, C(=O)O-CH(O-)-CBr₃) | tributyl amine | rectangular shape of 0.25 μm width |
| 50 | poly(p-vinyl phenol) | (structure with cyclopentene, C(=O)O-CH(O-)-C₂H₅) | imidazole | rectangular shape of 0.25 μm width |
| 51 | poly(p-vinyl phenol) | (structure with cyclopentene, C(=O)O-CH(O-)-C₆H₄-Cl) | 2-methyl benzoxazole | rectangular shape of 0.25 μm width |

TABLE 13

| Example | Alkali-soluble Polymer | Compound represented by General Formula | Basic Compound | Shape of Pattern |
|---|---|---|---|---|
| 52 | (polymer structure with CH₂—Si(CH₃)₂—O—Si(CH₃)₃ group, phenol rings with OH and CH₃ substituents) | (cyclopentene fused ester with OCHCl₃ group) | 2-methyl benzimidazole | sharp pattern profile of 0.25 μm width |
| 53 | (polymer with OCH₃, OH phenol substituted with HC—C₂H₅ linked to (Si—O)ₙ phenyl) | (cyclopentene fused ester with O-CH(NO₂-C₆H₄) group) | 2-methyl benzthiazole | sharp pattern profile of 0.25 μm width |
| 54 | (phenyl—(Si—O)ₙ—phenyl-OH polymer) | (cyclopentene fused ester with OCH=CH-C₆H₅ group) | imidazole | sharp pattern profile of 0.25 μm width |

TABLE 14

| Example | Alkali-soluble Polymer | Compound represented by General Formula | Basic Compound | Shape of Pattern |
|---|---|---|---|---|
| 55 | poly(p-vinyl phenol) | cyclohexene-1-carboxylate with -O-CH(H)-(CH$_2$)$_2$-Si(CH$_3$)$_2$-O-Si(CH$_3$)$_3$ substituent | 2-methyl benzimidazole | sharp pattern profile of 0.25 μm width |
| 56 | poly(p-vinyl phenol) | cyclopentene-1-carboxylate with -O-CH(H)-(CH$_2$)$_5$Si(CH$_3$)$_3$ substituent | 2-methyl benzthiazole | sharp pattern profile of 0.25 μm width |
| 57 | poly(p-vinyl phenol) | cyclohexene-1-carboxylate with -O-CH(H)-C$_6$H$_4$-(CH$_2$)$_3$-Si(CH$_3$)$_3$ substituent | 2-methyl benzimidazole | sharp pattern profile of 0.25 μm width |

TABLE 15

| Example | Alkali-soluble Polymer | Compound represented by General Formula | Basic Compound | Shape of Pattern |
|---|---|---|---|---|
| 58 | (structure) | (structure) | 2-methyl benzthiazole | sharp pattern profile of 0.25 μm width |
| 59 | (structure) | (structure) | tributyl amine | sharp pattern profile of 0.25 μm width |
| 60 | (structure) | (structure) | benzthiazole | sharp pattern profile of 0.25 μm width |
| 61 | (structure) | (structure) | 2-methyl benzimidazole | sharp pattern profile of 0.25 μm width |

TABLE 16
| Example | Alkali-soluble Polymer | Compound represented by General Formula (V) | Compound which produces acid by light-exposure |
|---|---|---|---|
| 62 | poly(p-vinyl phenol) | 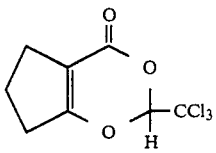 | 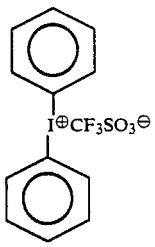 |
| 63 | m,p-cresol novolak | 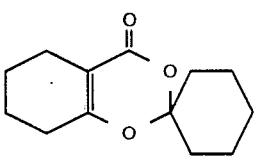 | 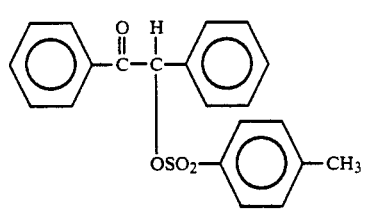 |
| 65 | 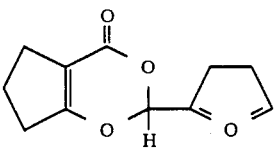 | 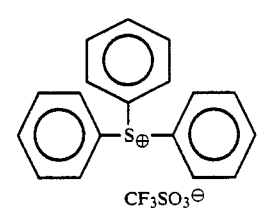 | 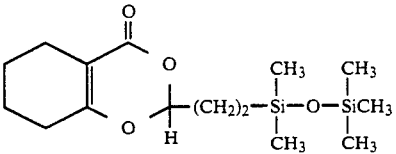 |
| 66 | poly(p-vinyl phenol) | 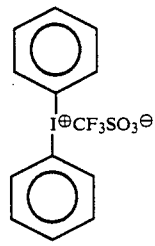 | 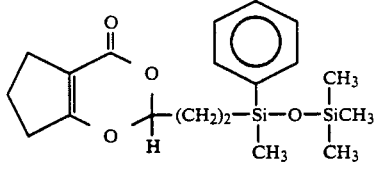 |
| 67 | poly(p-vinyl phenol) | 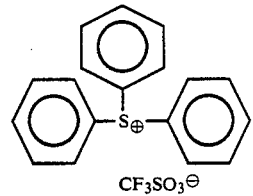 | 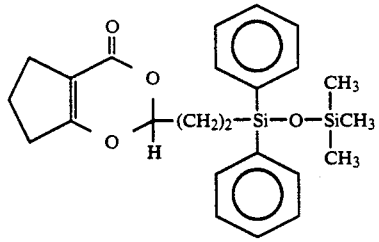 |
| 68 | m,p-cresol novolak | 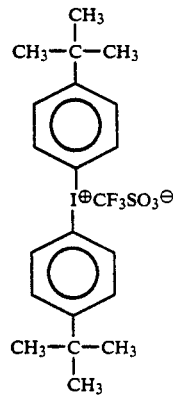 | |

TABLE 16-continued

| Example | Alkali-soluble Polymer | Compound represented by General Formula (V) | Compound which produces acid by light-exposure |
|---|---|---|---|
| 69 | 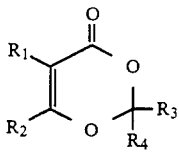 | 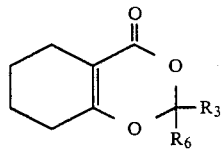 | 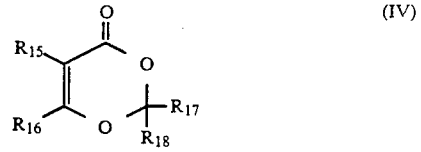 |

What is claimed is:

1. A photosensitive composition containing an alkali-soluble polymer having phenol skeletons and a compound represented by the following formula (I), (II) or (III):

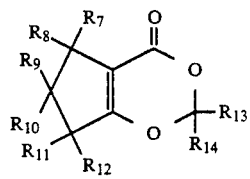

wherein $R_1$ and $R_2$ may be the same or different and independently represent a hydrogen atom or a substituted or unsubstituted alkyl group having 1 to 10 carbon atoms, and $R_3$ and $R_4$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_3$ and $R_4$ together form a cyclic structure represented by $-(CH_2)_{\overline{n}}$ (wherein n represents a positive integer of 4 to 8):

wherein $R_5$ and $R_6$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_5$ and $R_6$ together form a cyclic structure represented by $-(CH_2)_{\overline{n}}$ (wherein n represents a positive integer of 4 to 8):

wherein $R_7$, $R_8$, $R_9$, $R_{10}$, $R_{11}$ and $R_{12}$ may be the same or different and independently represent a hydrogen atom, a substituted or unsubstituted alkyl group having 1 to 10 carbon atoms, and $R_{13}$ and $R_{14}$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_{13}$ and $R_{14}$ together form a cyclic structure represented by $-(CH_2)_n$ (wherein n represents a positive integer of 4 to 8).

2. A composition according to claim 1, wherein said alkali-soluble polymer having phenol skeletons is a polymer containing silicon.

3. A composition according to claim 1 or 2, wherein a mixing ratio of a compound represented by said formula (I), (II) or (III) is 1 to 500 parts by weight with respect to 100 parts by weight of said alkali-soluble polymer.

4. A composition according to claim 1, wherein each of $R_3$, $R_5$ and $R_{13}$ of said formulas (I), (II) and (III), respectively, is a silicon-containing alkyl group or a silicon-containing aryl group, and each of $R_4$, $R_6$ and $R_{14}$ of said formulas (I), (II) and (III), respectively, is a hydrogen atom.

5. A composition according to claim 4, wherein a mixing ratio of a compound represented by said formula (I), (II) or (III) is 1 to 200 parts by weight with respect to 100 parts by weight of said alkali-soluble polymer.

6. A photosensitive composition containing an alkali-soluble polymer having phenol skeletons, a compound represented by the following formula (IV) and a basic compound:

wherein $R_{15}$ and $R_{16}$ may be the same or different and independently represent a hydrogen atom or a substituted or unsubstituted alkyl group having 1 to 10 carbon atoms, or $R_{15}$ and $R_{16}$ together form a cyclic structure represented by $-(CH_2)_{\overline{n}}$ (wherein n represents a positive integer of not less than 3) or a cyclic structure formed by substituting an alkyl group for a hydrogen atom in the structure represented by $-(CH_2)_{\overline{n}}$ (wherein n represents a positive integer of not less than 3), $R_{17}$ represents a hydrogen atom, a substituted or unsubstituted alkyl group having 1 to 10 carbon atoms, a substituted or unsubstituted aryl group, a furyl group, a pyridyl group or a 2-styryl group, and $R_{18}$ represents a hydrogen atom.

7. A composition according to claim 6, wherein a mixing ratio of a compound represented by said formula (IV) is 1 to 500 parts by weight with respect to 100 parts by weight of said alkali-soluble polymer, and a mixing ratio of said basic compound is 0.1 to 500 parts by weight with respect to 100 parts by weight of said alkali-soluble polymer.

8. A composition according to claim 6, wherein a compound represented by said formula (IV) is a compound represented by the following formula (V):

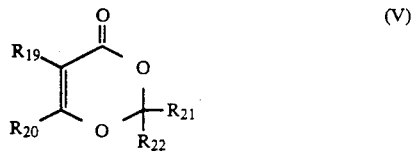

wherein $R_{19}$ and $R_{20}$ may be the same or different and independently represent a hydrogen atom or a substituted or unsubstituted alkyl group having 1 to 10 carbon atoms, or $R_{19}$ and $R_{20}$ together form a cyclic structure represented by $-(CH_2)_n-$ (wherein n represents a positive integer of not less than 3) or a cyclic structure formed by substituting an alkyl group for a hydrogen atom in the structure represented by $-(CH_2)_n-$ (wherein, n represents a positive integer of not less than 3), $R_{21}$ represents a silicon-containing alkyl group or a silicon-containing aryl group, and $R_{22}$ represents a hydrogen atom.

9. A composition according to claim 8, wherein a mixing ratio of a compound represented by said formula (V) is 1 to 200 parts by weight with respect to 100 parts by weight of said alkali-soluble polymer, and a mixing ratio of said basic compound is 0.1 to 200 parts by weight with respect to 100 parts by weight of said alkali-soluble polymer.

10. A composition according to claim 6, wherein said alkali-soluble polymer having phenol skeletons is a polymer containing silicon.

11. A composition according to claim 10, wherein a mixing ratio of a compound represented by said formula (IV) is 1 to 200 parts by weight with respect to 100 parts by weight of said alkali-soluble polymer, and a mixing ratio of said basic compound is 0.1 to 200 parts by weight with respect to 100 parts by weight of said alkali-soluble polymer.

12. A photosensitive composition containing an alkali-soluble polymer having phenol skeletons, a compound represented by the following formula (VI) and a compound which produces an acid upon radiation of light:

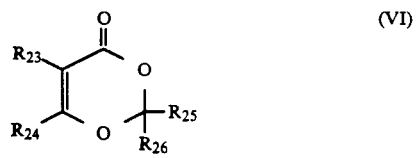

wherein $R_{23}$ and $R_{24}$ may be the same or different and independently represent a hydrogen atom or a substituted or unsubstituted alkyl group having 1 to 10 carbon atoms, or $R_{23}$ and $R_{24}$ together form a cyclic structure represented by $-(CH_2)_n-$ (wherein n represents a positive integer of not less than 3) or a cyclic structure formed by substituting an alkyl group for a hydrogen atom in the structure represented by $-(CH_2)_n-$ (wherein n represents a positive integer of not less than 3), and $R_{25}$ and $R_{26}$ may be the same or different and independently represent a hydrogen atom, a substituted or unsubstituted alkyl group having 1 to 10 carbon atoms, a substituted or unsubstituted aryl group, a furyl group, a pyridyl group or a 2-styryl group, or $R_{25}$ and $R_{26}$ together form a cyclic structure represented by $-(CH_2)_n-$ (wherein n represents a positive integer of not less than 4).

13. A composition according to claim 12, wherein a mixing ratio of a compound represented by said formula (VI) is 1 to 500 parts by weight with respect to 100 parts by weight of said alkali-soluble polymer, and a mixing ratio of said compound which produces an acid upon radiation of light is about 0.01 to about 10 parts by weight with respect to the total weight of a contained solid component.

14. A composition according to claim 12, wherein a compound represented by said formula (VI) is a compound represented by the following formula (VII):

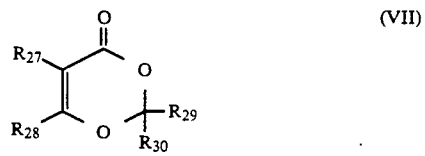

wherein $R_{27}$ and $R_{28}$ may be the same or different and independently represent a hydrogen atom or a substituted or unsubstituted alkyl group having 1 to 10 carbon atoms, or $R_{27}$ and $R_{28}$ together form a cyclic structure represented by $-(CH_2)_n-$ (wherein n represents a positive integer of not less than 3) or a cyclic structure formed by substituting an alkyl group for a hydrogen atom in the structure represented by $-(CH_2)_n-$ (wherein n represents a positive integer of not less than 3), $R_{29}$ represents a silicon-containing alkyl group or a silicon-containing aryl group, and $R_{30}$ represents a hydrogen atom.

15. A composition according to claim 14, wherein a mixing ratio of a compound represented by said formula (VII) is 1 to 200 parts by weight with respect to 100 parts by weight of said alkali-soluble polymer, and a mixing ratio of said compound which produces an acid upon radiation of light is about 0.01 to about 10 parts by weight with respect to the total weight of a contained solid component.

16. A composition according to claim 12, wherein said alkali soluble-polymer having phenol skeletons is a polymer containing silicon.

17. A composition according to claim 16, wherein a mixing ratio of a compound represented by said formula (VI) is 1 to 200 parts by weight with respect to 100 parts by weight of said alkali-soluble polymer, and a mixing ratio of said compound which produces an acid upon radiation of light is about 0.01 to about 10 parts by weight with respect to the total weight of a contained solid component.

18. The photosensitive composition of claim 1, wherein said compound of formula (III) is

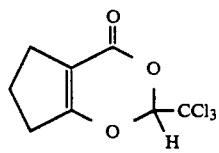

* * * * *